US007248191B2

(12) United States Patent
Tanaka et al.

(10) Patent No.: US 7,248,191 B2
(45) Date of Patent: Jul. 24, 2007

(54) VARIABLE-LENGTH CODING METHOD, VARIABLE-LENGTH CODING DEVICE AND IMAGING SYSTEM

(75) Inventors: Yasuharu Tanaka, Osaka (JP); Shinji Kitamura, Kyoto (JP); Taichi Nagata, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 11/444,438

(22) Filed: Jun. 1, 2006

(65) Prior Publication Data

US 2006/0273939 A1    Dec. 7, 2006

(30) Foreign Application Priority Data

Jun. 1, 2005    (JP)    ............................. 2005-161813

(51) Int. Cl.
*H03M 7/40*    (2006.01)

(52) U.S. Cl. ........................................ 341/67; 382/233

(58) Field of Classification Search .................. 341/67; 382/233
See application file for complete search history.

(56) References Cited

U.S. PATENT DOCUMENTS 6,574,369 B2 *    6/2003    Boon ........................ 382/233

FOREIGN PATENT DOCUMENTS

JP    3573735 B    7/2004
WO    WO 01/91470 A    11/2001

* cited by examiner

*Primary Examiner*—Rexford Barnie
*Assistant Examiner*—Joseph Lauture
(74) *Attorney, Agent, or Firm*—McDermott Will & Emery LLP

(57) ABSTRACT

A VLC mode judgment section performs judgment on whether or not a received group (Last, Run, Level) exists in a VLC table and then performs judgment on which one of a first escape mode, a second escape more and a third escape mode is suitable. According to a judgment result of the VLC mode judgment section, an FLC processing section or a coding mode selection section performs variable-length coding using selected one of the received group (Last, Run, Level), a group generated in the first escape mode, and a group generated by the second escape group or fixed-length coding using a third escape mode.

28 Claims, 28 Drawing Sheets

FIG.3

| Intra/Inter | Last | Run | Absolute value of Level | VLC mode judgment result |
|---|---|---|---|---|
| Intra | 0 | 0 | 1 | 00 |
| | 0 | 1 | 11 | 01 |
| | 0 | 3 | 5 | 01 |
| | 0 | 3 | 9 | 10 |
| | 0 | 4 | 7 | 11 |
| | 0 | 9 | 2 | 00 |
| | 1 | 2 | 3 | 01 |
| | 1 | 3 | 5 | 11 |
| | ⋮ | ⋮ | ⋮ | ⋮ |
| Inter | 0 | 2 | 2 | 00 |
| | 0 | 2 | 5 | 01 |
| | 0 | 11 | 3 | 01 |
| | 0 | 22 | 2 | 01 |
| | 1 | 0 | 1 | 00 |
| | 1 | 2 | 3 | 11 |
| | ⋮ | ⋮ | ⋮ | ⋮ |

FIG.4

| VLC mode judgment result | Description |
|---|---|
| 00 | Group (Last, Run, Level) exists in VLC table |
| 01 | Group after 1st escape mode processing exists in VLC table |
| 10 | Group after 2nd escape mode processing exists in VLC table |
| 11 | Other case than three listed above (3rd escape mode) |

FIG.5

| Intra/Inter | Last | Run | LMAX |
|---|---|---|---|
| Intra | 0 | 0 | 27 |
| | 0 | 1 | 10 |
| | 0 | 2 | 5 |
| | 0 | 3 | 4 |
| | 0 | 9 | 2 |
| | ⋮ | ⋮ | ⋮ |
| | 1 | 0 | 8 |
| | 1 | 3 | 2 |
| | ⋮ | ⋮ | ⋮ |
| Inter | 0 | 0 | 12 |
| | 0 | 1 | 6 |
| | 0 | 2 | 4 |
| | 0 | 3 | 3 |
| | 0 | 4 | 3 |
| | ⋮ | ⋮ | ⋮ |
| | 1 | 0 | 3 |
| | 1 | 3 | 1 |
| | ⋮ | ⋮ | ⋮ |

FIG.6

| Intra/Inter | Last | Absolute value of Level | RMAX |
|---|---|---|---|
| Intra | 0 | 1 | 14 |
| | 0 | 2 | 9 |
| | 0 | 3 | 7 |
| | 0 | 4 | 3 |
| | 0 | 9 | 1 |
| | ⋮ | ⋮ | ⋮ |
| | 1 | 1 | 20 |
| | 1 | 5 | 0 |
| | ⋮ | ⋮ | ⋮ |
| Inter | 0 | 1 | 26 |
| | 0 | 2 | 10 |
| | 0 | 3 | 6 |
| | 0 | 4 | 2 |
| | 0 | 5 | 1 |
| | ⋮ | ⋮ | ⋮ |
| | 1 | 1 | 40 |
| | 1 | 7 | — |
| | ⋮ | ⋮ | ⋮ |

FIG.7

| VLC mode judgment result | Effective group | Output direction |
|---|---|---|
| 00 | (Last, Run, Level) | VLC processing section |
| 01 | (Last, Run, NewLevel) after 1st escape mode processing | VLC processing section |
| 10 | (Last, NewRun, Level) after 2nd escape mode processing | VLC processing section |
| 11 | (Last, Run, Level) | FLC processing section |

FIG.9

| Intra/Inter | Last | Run | Absolute value of Level | Coding result |
|---|---|---|---|---|
| Intra | 0 | 0 | 1 | 100 |
| | 0 | 1 | −9 | 0000010100111 |
| | 0 | 9 | 2 | 000001000110 |
| | ⋮ | ⋮ | ⋮ | ⋮ |
| | 1 | 2 | 2 | 00000001000 |
| | ⋮ | ⋮ | ⋮ | ⋮ |
| Inter | 0 | 2 | 1 | 11100 |
| | 0 | 2 | −1 | 11101 |
| | ⋮ | ⋮ | ⋮ | ⋮ |

FIG.10

| Last | Code |
|---|---|
| 0 | 0 |
| 1 | 1 |

FIG.11

| Run | Code |
|---|---|
| 0 | 000000 |
| 1 | 000001 |
| 2 | 000010 |
| ⋮ | ⋮ |
| 63 | 111111 |

FIG.12

| Level | Code |
|---|---|
| −2047 | 100000000001 |
| ⋮ | ⋮ |
| −2 | 111111111110 |
| −1 | 111111111111 |
| 0 | − |
| 1 | 000000000001 |
| 2 | 000000000010 |
| ⋮ | ⋮ |
| 2047 | 011111111111 |

FIG.13

| VLC mode judgment result | Code to be added |
|---|---|
| 00 | − |
| 01 | 000001101 |
| 10 | 000001110 |
| 11 | 000001111 |

FIG.17

| VLC mode judgment result | Output direction |
|---|---|
| 00 | VLC processing section |
| 01 | VLC processing section |
| 10 | VLC processing section |
| 11 | FLC processing section |

FIG.21

| Intra/Inter | Last | LevelThr | RunThr |
|---|---|---|---|
| Intra | 0 | 54 | 29 |
| | 1 | 16 | 41 |
| Inter | 0 | 24 | 53 |
| | 1 | 6 | 64 |

FIG.22

| FLC mode judgment result | Description |
|---|---|
| 0 | Not clear whether coding in 3rd escape mode is optimum |
| 1 | Coding in 3rd escape mode is optimum |

FIG.26

| Subsequent mode request information | VLC mode judgment result | Effective group | Output direction |
|---|---|---|---|
| 00 | 00 | (Last, Run, Level) | VLC processing |
| | 01 | (Last, Run, NewLevel) after 1st escape mode processing | VLC processing |
| | 10 | (Last, NewRun, Level) after 2nd escape mode processing | VLC processing |
| | 11 | (Last, Run, Level) | FLC processing |
| 01 | 00 | (Last, Run, NewLevel) after 1st escape mode processing | VLC processing |
| 10 | 00 | (Last, NewRun, Level) after 2nd escape mode processing | VLC processing |
| | | (Last, Run, Level) | FLC processing |

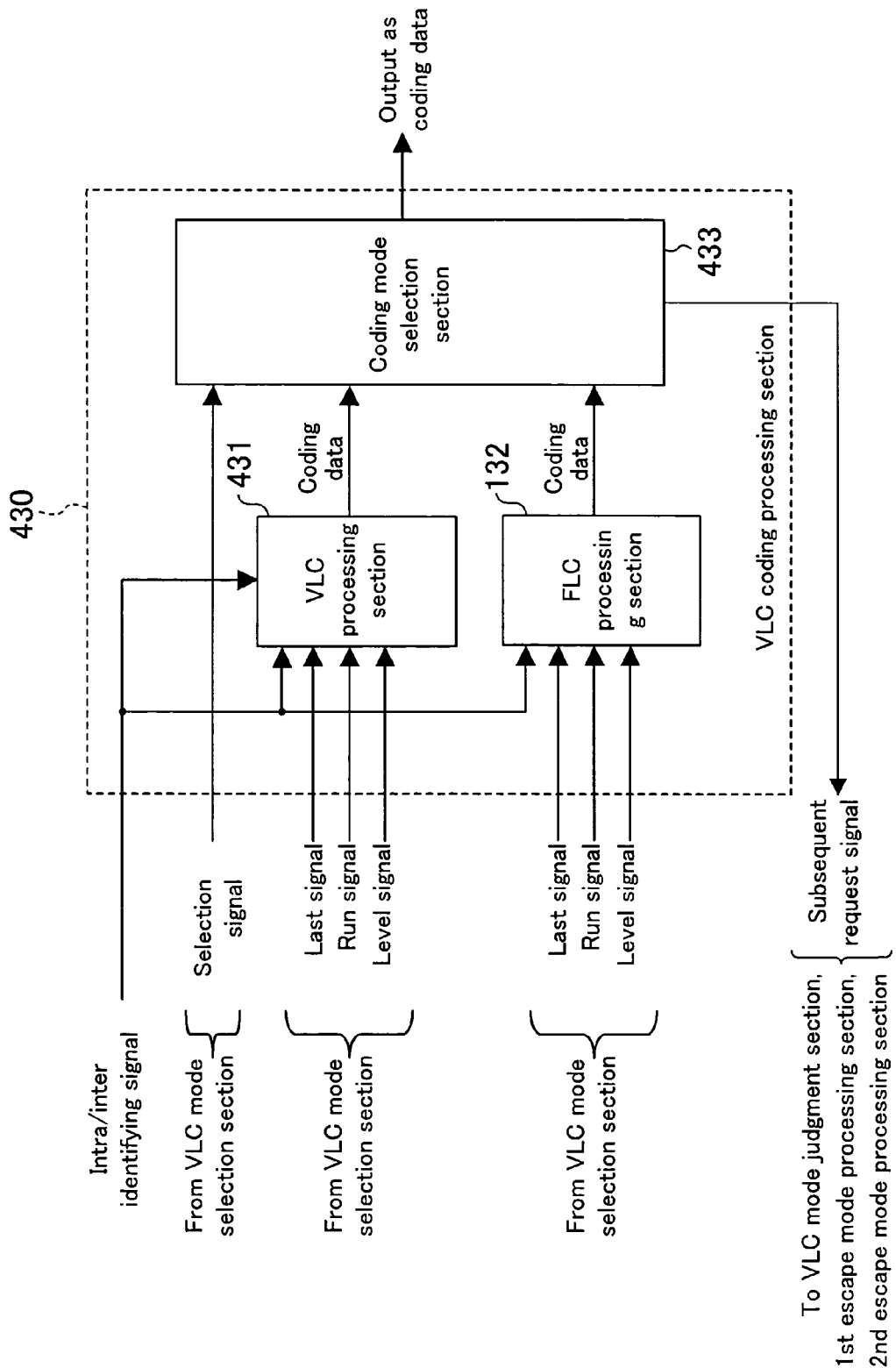

VARIABLE-LENGTH CODING METHOD, VARIABLE-LENGTH CODING DEVICE AND IMAGING SYSTEM

CROSS REFERENCE TO RELATED APPLICATIONS

The disclosure of Japanese Patent Application No. 2005-161813 filed on Jun. 1, 2005 including specification, drawings and claims are incorporated herein by reference in its entirety.

BACKGROUND OF THE INVENTION

1. Field of the Invention

The present invention relates to a variable-length coding method, a variable-length coding device and an imaging system, which are realized in the MPEG mode, for coding picture data or the like.

2. Description of the Prior Art

Technologies for compressing picture data at a high compression rate have been advanced and used for digital cameras and digital video cameras.

For example, as a method for compressing moving picture data, the MPEG (moving picture experts groups) method standardized by ISO has been known in general. The MPEG method is characterized in that coding using an intraframe correlation (which will be hereafter referred to as "intracoding") or coding using an interframe correlation (which will be hereafter referred to as "interceding") is performed for each block (which will be hereafter referred to as "macroblock") including a plurality of pixels and constituting a frame.

In the above-described types of coding, specifically, DCT (discrete cosine transform) which is a quadrature transform is performed to data in a macroblock and then quantization and variable-length coding are performed thereto, thereby compressing picture data.

In variable-length coding (VLC processing) using VLC (variable-length code), assuming that Run indicating the number of zero coefficients before a non-zero coefficient, Level indicating a non-zero coefficient value, and Last indicating whether or not the non-zero coefficient is the last coefficient form a group (coefficient series), a DCT coefficient obtained as a result of DCT is coded by uniquely allocating a code to the group (Last, Run, Level). In MPEG compression, a variable-length coding is performed using a VLC table defined for the purpose of allocation of a unique code.

When variable-length coding is performed using a VLC table but a VLC corresponding to the group (Last, Run, Level) is not defined in the VLC table, coding is performed with application of the following three escape modes.

In a first escape mode, NewLevel is obtained as a new Level for the group (Last, Run, Level) by subtracting LMAX which is a maximum value of Level corresponding to Last and Run in a VLC table from an absolute value of Level and then putting the sign of Level to a result of the subtraction. Then, VLC processing is performed again, this time, to a group (Last, Run, NewLevel) using the VLC table.

The following is an equation for obtaining NewLevel.

$$NewLevel = sign(Level) \times (|Level| - LMAX)$$

where sign (Level) is the sign of Level and |Level| is an absolute value of Level.

In a second escape mode, NewRun is obtained as a new Run for the group (Last, Run, Level) by subtracting a value obtained by adding 1 to RMAX which is a maximum value of Run corresponding to Last and Level in the VLC table from a value of Run. Then, VLC processing is performed again, this time, to a group (Last, NewRun, Level) using the VLC table.

The following is an equation for obtaining NewRun.

$$NewRun = Run - (RMAX + 1)$$

In a third escape mode, the group (Last, Run, Level) is transformed to FLC (fixed length code).

FIG. 31 is a flow chart schematically showing the order in which process steps are performed and a flow of information (signal) in each process step.

First, VLC processing is performed to a group (Last, Run, Level) and, if the group is successfully coded, a code (effective code) is output (Step S1).

Whether or not the output code is an effective code is judged (Step S2) and, if it is judged that the output code is an effective code, the code is output and coding is completed (Step S3).

If coding is not completed in Step S1, whether or not the first escape mode has been already performed using LMAX is judged (Step S4).

If the first escape mode has not been performed, NewLevel is obtained by calculation using the equation for obtaining NewLevel to generate a group (Last, Run, NewLevel) (Step S5) and then the VLC processing of Step S1 is performed again. Whether or not the output code is an effective code is judged (Step S2) and, if it is judged that the output code is an effective code, the code is output and coding is completed (Step S3).

If coding is not completed in Step S4, whether or not the second escape mode has been already performed using RMAX is judged (Step S6).

If the second escape mode has not been performed, NewRun is obtained by calculation using the equation for obtaining NewRun to generate a group (Last, NewRun, Level) (Step S7) and then the VLC processing of Step S1 is performed again. Whether or not the output code is an effective code is judged (Step S2) and, if it is judged that the output code is an effective code, the code is output and coding is completed (Step S3).

If coding is not completed in Step S6, transform (FLC processing) is performed to the group (Last, Run, Level) to obtain FLC (fixed-length code) (Step S8). Then, a result of the FLC processing is output and coding is completed (Step S3).

As described above, in VLC processing in the known MPEG compression, with a cycle in which an output result is obtained using a VLC table assumed to be 1 cycle, three cycles are required to obtain FLC. That is, in the case of data needing FLC processing to be performed for many times, many processing cycles are required, so that the problem of reduction in processing speed arises.

As a method for realizing coding with fewer cycles even for data needing FCL processing to be performed for many times, a processing method with procedures shown in FIG. 32 has been proposed (see, for example, Japanese Patent Publication No. 3573735).

In this method, separate processing steps for FLC processing are parallelly performed. That is, VCL processing for a received group (Last, Run, Level), VLC processing for a group (Last, Run, NewLevel) newly generated by calculation using the equation for obtaining NewLevel in the first escape mode, VLC processing for a group (Last, NewRun, Level) newly generated by calculation using the equation for obtaining NewRun in the second escape mode, and FLC processing for the group (Last, Run, Level) in the third escape mode are performed in parallel.

In a system which realizes processing according to the above-described method, three separate VLC processing are parallelly performed, and therefore three VLC tables in total are provided in the system.

For outputs by the above-described three VLC processing as well as outputs by some other VCL processing, a single output is selected according to predetermined priorities.

According to this method, if a processing cycle of a VLC table is assumed to be 1 cycle, coding can be completed in 1 cycle.

However, in the above-described method in which three VLC processing are performed in parallel, a processing cycle of coding is reduced but three parallel VLC tables have to be provided. Therefore, a circuit size in a coding system for realizing this method is unexpectedly increased.

SUMMARY OF THE INVENTION

The present invention has been devised in view of the above-described problems and it is therefore an object of the present invention to provide a variable-length coding method and a variable-length coding system which allow effective variable-length coding while suppressing increase in circuit size of the variable-length coding system and reducing a processing cycle.

To solve the above-described problems, the present invention provides a variable-length coding system for generating variable-length coding data from a coefficient series, the coefficient series including Run, Level and Last, Run indicating the number of zero coefficients before a non-zero coefficient, Level indicating a value of a non-zero coefficient, Last indicating whether or not the non-zero coefficient is the last coefficient in a DCT coefficient obtained by performing discrete cosine transform to digital data, and the system is characterized by including: a first coefficient series generation section for generating a first coefficient series in which Level is replaced with NewLevel obtained, based on an equation of NewLevel=sign(Level)×(|Level|−LMAX) where sign(Level) is a code of Level and |Level| is an absolute value of Level, using LMAX which is a maximum value of Level corresponding to Last and Run in a given coefficient series in a VLC table showing the correlation between a coefficient series to be variable-length coded and variable-length coding data obtained by variable-length coding the coefficient series; a second coefficient series generation section for generating a second coefficient series in which Run in a given coefficient series is replaced with NewRun obtained, based on an equation of NewRun=Run−(RMA+1), using RMAX which is a maximum value of Run corresponding to Last and Level in the given coefficient series in the VLC table; a VLC mode judgment section for judging, according to a given coefficient series, which one of a mode for coding the given coefficient series by variable-length coding, a mode for coding the first coefficient series by variable-length coding, a mode for coding the second coefficient series by variable-length coding and a mode for coding a given coefficient series by fixed-length coding should be used; a coefficient series output section for outputting, based on a judgment result of the VLC mode judgment section, one of the given coefficient series, the first coefficient series and the second coefficient series; a variable-length coding section for generating, based on the VLC table, variable-length coding data from the coefficient series output in the coefficient series outputting section; a fixed-length coding section for generating fixed-length coding data obtained by fixed-length coding the coefficient series output by the coefficient series outputting section; and a coding data outputting section for outputting, based on the judgment result of the VLC judgment section, one of the variable-length coding data and the fixed-length coding data.

Thus, a suitable coding mode for a received coefficient series is determined before variable-length coding is performed. Therefore, VLC processing can be efficiently performed. Moreover, the variable-length coding system does not have to include a plurality of VLC tables. Therefore, increase in a circuit size of the system can be suppressed.

In one embodiment of the present invention, the variable-length coding system is characterized in that the variable-length coding system further includes a FLC mode judgment section for judging, according to a given coefficient series, which variable-length coding or fixed-length coding should be performed to the given coefficient series, and when a judgment result of the FLC mode judgment section indicates that variable-length coding should be performed, the VLC mode judgment section judges which mode should be used for coding.

Thus, FLC mode judgment which only requires comparison processing and can be performed in a more simple manner than VLC mode judgment is performed before VLC mode judgment, so that the number of coefficient series to which VLC mode judgment is performed can be reduced.

In another embodiment of the present invention, the variable-length coding system is characterized in that when the judgment result of the VLC mode judgment section indicates that the first coefficient series should be coded in the mode for coding the first coefficient series by variable-length coding, the first coefficient series generation section generates the first coefficient series, and when the judgment result of the VLC mode judgment section indicates that the second coefficient series should be coded in the mode for coding the second coefficient series by variable-length coding, the second coefficient series generation section generates the second coefficient series.

Thus, it is only necessary to generate one of the first coefficient series and the second coefficient series. Therefore, a single circuit can be commonly used for generating the first coefficient series and the second coefficient series. This contributes to reduction in circuit size of the system.

In another embodiment of the present invention, the variable-length coding system is characterized in that the VLC mode judgment section judges, using a VLC mode judgment table in which mode information indicating a correlation between a given coefficient series and a mode for coding the given coefficient series is stored, which mode should be used for coding.

Thus, a VLC mode judgment table is detected and a coding mode is determined.

In another embodiment of the present invention, the variable-length coding system is characterized in that the mode information is divided and stored separately in a plurality of VLC mode judgment tables.

Thus, a VLC mode judgment table can be more efficiently detected.

In another embodiment of the present invention, the variable-length coding system is characterized in that the VLC mode judgment table stores mode information for a coefficient series in which Run has a smaller value than a predetermined value.

Thus, coding can be efficiently performed, in one step, a coefficient series in which Run has a smaller value than the predetermined value.

In another embodiment of the present invention, the variable-length coding system is characterized in that the digital data is data obtained by intraframe coding or interframe coding of image data, and the plurality of VLC mode judgment tables include a VLC mode judgment table for a coefficient series corresponding to the image data obtained by intraframe coding and a VLC mode judgment table for a coefficient series corresponding to the image data obtained by interframe coding.

Thus, a mode for coding can be efficiently determined in one step, according to the predictive coding mode for image data.

In another embodiment of the present invention, the variable-length coding system is characterized in that the digital data is data obtained by intraframe coding or interframe coding of image data, and the VLC mode judgment table stores mode information for one of a coefficient series corresponding to the image data coded by intraframe coding and a coefficient series corresponding to the image data coded by interframe coding.

Thus, a size of a VLC mode judgment table can be reduced and a small size coding system can be constructed.

In another embodiment of the present invention, the variable-length coding system is characterized in that the plurality of VLC mode judgment tables include a VLC mode judgment table for a coefficient series in which a value of Last indicates that the last coefficient is a non-zero coefficient and a VLC mode judgment table for a coefficient series in which a value of Last indicates that the last coefficient is not a non-zero coefficient.

Thus, a detection range for a VLC mode judgment table can be limited according to a value of Last, so that a mode for coding can be efficiently determined in one step.

In another embodiment of the present invention, the variable-length coding system is characterized in that the VLC mode judgment table stores mode information for one of a coefficient series in which a value of Last indicates that the last coefficient is a non-zero coefficient and a coefficient series in which a value of Last indicates that the last coefficient is not a non-zero coefficient.

Thus, a size of a VLC mode judgment table can be reduced, so that a small size coding system can be constructed.

In one embodiment of the present invention, the variable-length coding system is characterized in that the VLC mode judgment table is formed so that a mode resulting in a smaller code amount is selected, as a judgment result, from the mode for coding the first coefficient series by variable-length coding and the mode for coding the second coefficient series by variable-length coding.

Thus, a coding mode resulting in a smaller code amount after variable-length coding is selected and efficient coding data is generated.

In another embodiment of the present invention, the variable-length coding system is characterized in that the fixed-length coding section performs fixed-length coding, based on a FLC table indicating a correlation between a coefficient series which should be coded by variable-length coding and fixed-length coding data obtained by coding the coefficient series by fixed-length coding.

Thus, with reference to a table, fixed-length coding data is generated.

In another embodiment of the present invention, the variable-length coding system is characterized in that the variable-length coding system further includes: a VLC table memory for storing the VLC table; and a FLC table memory for storing the FLC table memory, only when the VLC table is used, the VLC table memory supplies a clock signal for operation and, only when the FLC table is used, the FLC table memory supplies a clock signal for operation.

In another embodiment of the present invention, the variable-length coding system is characterized in that the variable-length coding system further includes a plurality of VLC mode judgment table memories corresponding to the plurality of VLC mode judgment tables, respectively, and a clock signal for operation is supplied only to one of the VLC mode judgment table memories corresponding to one of the VLC mode judgment tables which is in use.

Thus, an operation clock signal is supplied only to a memory where one of the plurality of tables which is to be used is stored, so that power consumption can be reduced.

In another embodiment of the present invention, an imaging system is characterized by comprising: the variable-length coding system; a sensor for translating image light to an image signal; an optical system for imaging incident image light on the sensor; and a converter for converting the image signal into digital data and outputting the digital data to the variable-length coding system.

In another embodiment of the present invention, an imaging system is characterized by including: the variable-length coding system; and a converter for converting a received image signal of an analog value into digital data and outputting the digital data to the variable-length coding system.

Thus, an imaging system, such as a digital still camera (DSC) and the like, which can perform efficiently perform variable-length coding while suppressing increase in circuit size can be constructed.

BRIEF DESCRIPTION OF THE DRAWINGS

FIG. 3 is a table showing excerpted part from a VLC mode judgment table.

FIG. 4 is a table showing the correlation between values output as VLC mode judgment result and meaning of judgment result.

FIG. 5 is a table showing excerpted part from an LMAX table.

FIG. 6 is a table showing excerpted part from an RMAX table.

FIG. 7 is a table showing the correlation between a VLC mode judgment result and output direction of a VLC mode selection section according to the first embodiment of the present invention.

FIG. 9 is a table showing excerpted part from a VLC table.

FIG. 10 is a table showing excerpted part from an FLC table (for allocation of fixed-length to Last).

FIG. 11 is a table showing excerpted part from the FLC table (for allocation of fixed-length to Run).

FIG. 12 is a table showing excerpted part from the FLC table (for allocation of fixed-length to Level).

FIG. 13 is a table showing the correlation between VLC mode judgment result and code added according to escape mode.

FIG. 17 is a table showing the correlation between VLC mode judgment result and output direction of a VLC mode selection section according to the second embodiment of the present invention.

FIG. 21 is an exemplary FLC mode judgment table.

FIG. 22 is a table showing the correlation between values output as FLC mode judgment result and meaning of judgment result.

FIG. 26 is a table showing the correlation between VLC mode judgment result, subsequent mode request information and output direction of a VLC mode selection section according to the fourth embodiment of the present invention.

FIG. 27 is a block diagram illustrating a configuration of a VLC coding pre-processing section according to the fourth embodiment of the present invention.

DESCRIPTION OF THE PREFERRED EMBODIMENTS

Hereafter, embodiments of the present invention will be described with reference to the accompanying drawings.

Embodiment 1

Figure 1:
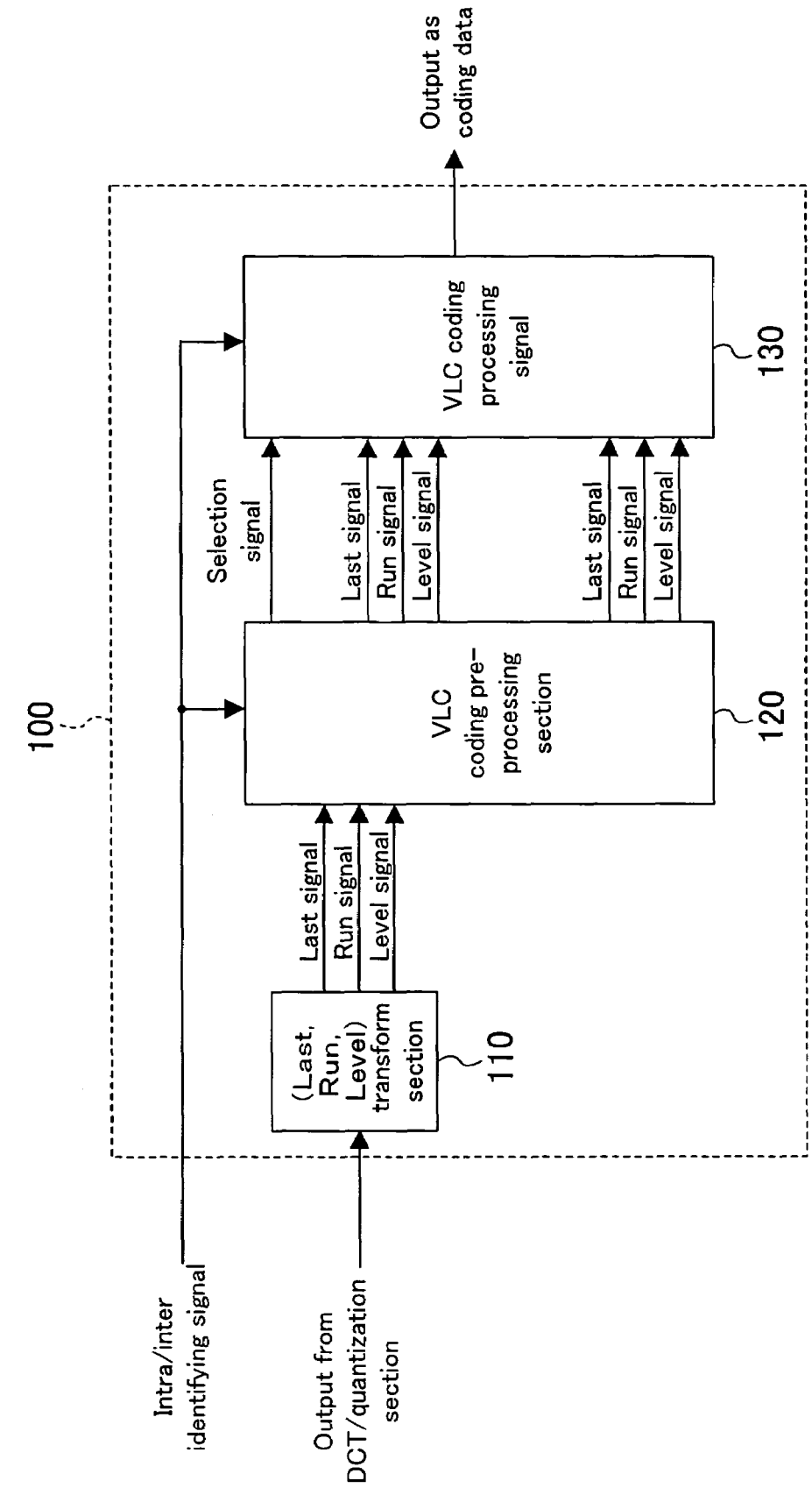
FIG. 1 is a block diagram illustrating a configuration of a variable-length coding system according to a first embodiment of the present invention.

FIG. 1 is a block diagram illustrating a configuration of a variable-length coding system 100 according to a first embodiment of the present invention. As shown in FIG. 1, the variable-length coding system 100 includes a transform section 110, a VLC coding pre-processing section 120, and a VLC coding section 130.

(Configuration of Transform Section 110)

The transform section 110 obtains Run, Level and Last for a DCT coefficient obtained from a result of DCT (discrete cosine transform) and quantization performed to data in a macroblock by a DCT/quantization section (not shown) and outputs Run, Level and Last as a group (coefficient series) (Last, Run, Level) to the VLC coding pre-processing section 120. Run indicates the number of preceding zero-coefficients, Level indicates a value of a non-zero coefficient and Last indicates whether or not the non-zero coefficient is the last coefficient. Specifically, as shown in FIG. 1, Run, Level and Last in the group (Last, Run, Level) are output as a Last signal, a Run signal and a Level signal, respectively, to the VLC coding pre-processing section 120.

(Configuration of VLC Coding Pre-processing Section 120)

The VLC coding pre-processing section 120 selects, according to a predictive coding mode (intraframe coding or interframe coding) of a macroblock and respective values of Last, Run and Level, one of a received group (Last, Run, Level), a group (Last, Run, Level) generated by a first escape mode (which will be later described) and a group (Last, Run, Level) generated by a second escape mode (which will be later described), and outputs the selected group to the VLC coding section 130.

Figure 2:
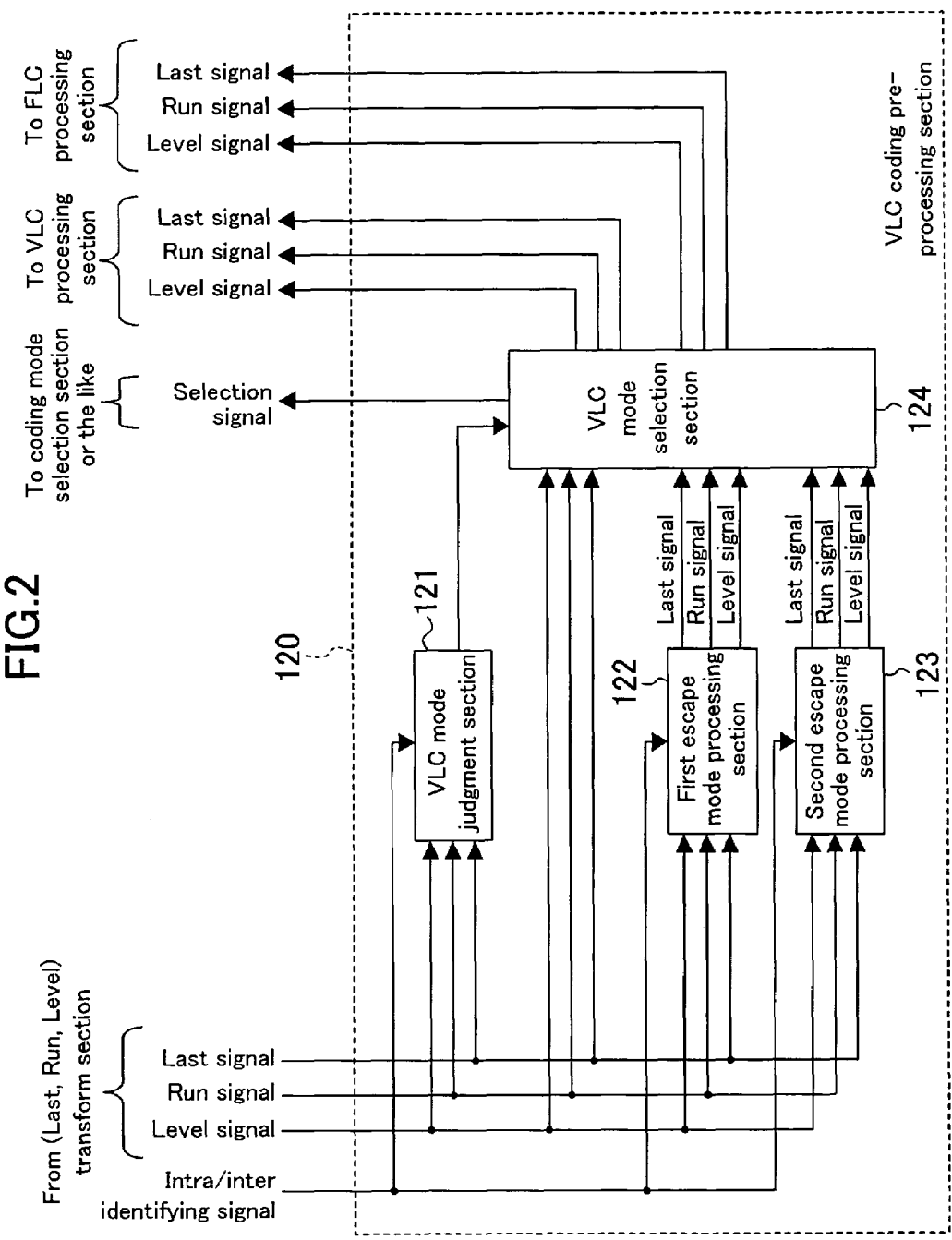
FIG. 2 is a diagram illustrating the configuration of a VLC coding pre-processing section according to the first embodiment of the present invention.

Specifically, as shown in FIG. 2, the VLC coding pre-processing section 120 is configured so as to include a VLC mode judgment section 121, a first escape mode processing section 122, a second escape mode processing section 123 and a VLC mode selection section 124.

(Configuration of VLC Mode Judgment Section 121)

According to the predictive coding mode and a combination of the respective values of Last, Run and Level, the VLC mode judgment section 121 judges using a table shown in FIG. 3 whether or not the group (Last, Run, Level) generated by the transform section 110 exists in a VLC table (this judgment will be hereafter referred to as "VLC mode judgment"). Information (predictive coding information) for the predictive coding mode is received as an intra/inter identifying signal from the outside of the variable-length coding system 100.

If the group (Last, Run, Level) does not exist in the VLC table, the VLC mode judgment section 121 judges which one of three escape modes (to be described later) is used in coding (this judgment will be hereafter referred to as "escape mode judgment").

Results of the VLC mode judgment and the escape mode judgment are output as VLC mode result signals to the VLC mode selection section 124. In this embodiment, each judgment result corresponds to a value to be output as the VLC mode judgment result signal (i.e., "00", "01", "10" or "11") in the manner shown in FIG. 4.

(Configuration of First Escape Mode Processing Section 122)

The first escape mode processing section 122 obtains NewLevel, based on the group (Last, Run, Level) output by the transform section 110 and the predictive coding mode, using an equation (shown below) for obtaining NewLevel and outputs, as a new group, a group (Last, Run, NewLevel) obtained by replacing Level with Newlevel to the VLC mode selection section 124 (this processing will be hereafter referred to as "first escape mode processing").

The following equation is an equation for obtaining NewLevel.

NewLevel=sign(Level)×(|Level|−LMAX)

where sign(Level) is the sign of Level and |Level| is an absolute value of Level.

LMAX used in the equation for obtaining NewLevel is a maximum value of Level corresponding to Last and Run in a given coefficient series in a VLC table indicating the correlation between a coefficient series which should be variable-length coded and variable-length coded data obtained by variable-length coding the coefficient series. Specifically, a value of LMAX can be obtained using a LMAX table. Excerpted Part from the LMAX table is shown in FIG. 5.

(Configuration of Second Escape Mode Processing Section 123)

The second escape mode processing section 123 obtains NewLevel, based on the group (Last, Run, Level) output by the transform section 110 and the predictive coding mode, using an equation (shown below) for obtaining NewRun and outputs, as a new group, a group (Last, NewRun, Level) in which Run has been replaced with NewRun to the VLC mode selection section 124 (this processing will be hereafter referred to as "second escape mode processing").

The following equation is an equation for obtaining NewRun.

NewRun=Run−(RMAX+1)

RMAX used in the equation for obtaining NewRun is a maximum value of Run corresponding to Last and Level in a given coefficient series in the VLC table. Specifically, RMAX is obtained using a RMAX table. Excerpted part from the RMAX table is shown in FIG. 6.

(Configuration of VLC Mode Selection Section 124)

The VLC mode selection section 124 selects, based on the VLC mode judgment result, one of the three groups, i.e., the group (Last, Run, Level) output by the transform section 110, the group (Last, Run, NewLevel) output by the first escape mode processing section 122 and the group (Last, NewRun, Level) output by the second escape mode processing section 123.

The VLC mode selection section 124 determines paths for outputting the selected group (i.e., a path for outputting the group to a VLC processing section 131 to be described later and a path for outputting the group to an FLC processing section 132 to be described later) and outputs the selected group to the VLC coding section 130 through one selected from the paths.

Based on a table shown in FIG. 7, a group is selected and a path for outputting the selected path is determined.

The VLC mode selection section 124 outputs a selection signal including selection information on which path has been selected and when the path has been selected to the VLC coding section 130. The selection signal further includes the VLC mode judgment result and is used in the VLC coding section 130 in the manner described later.

(Configuration of VLC Coding Section 130)

Figure 8:
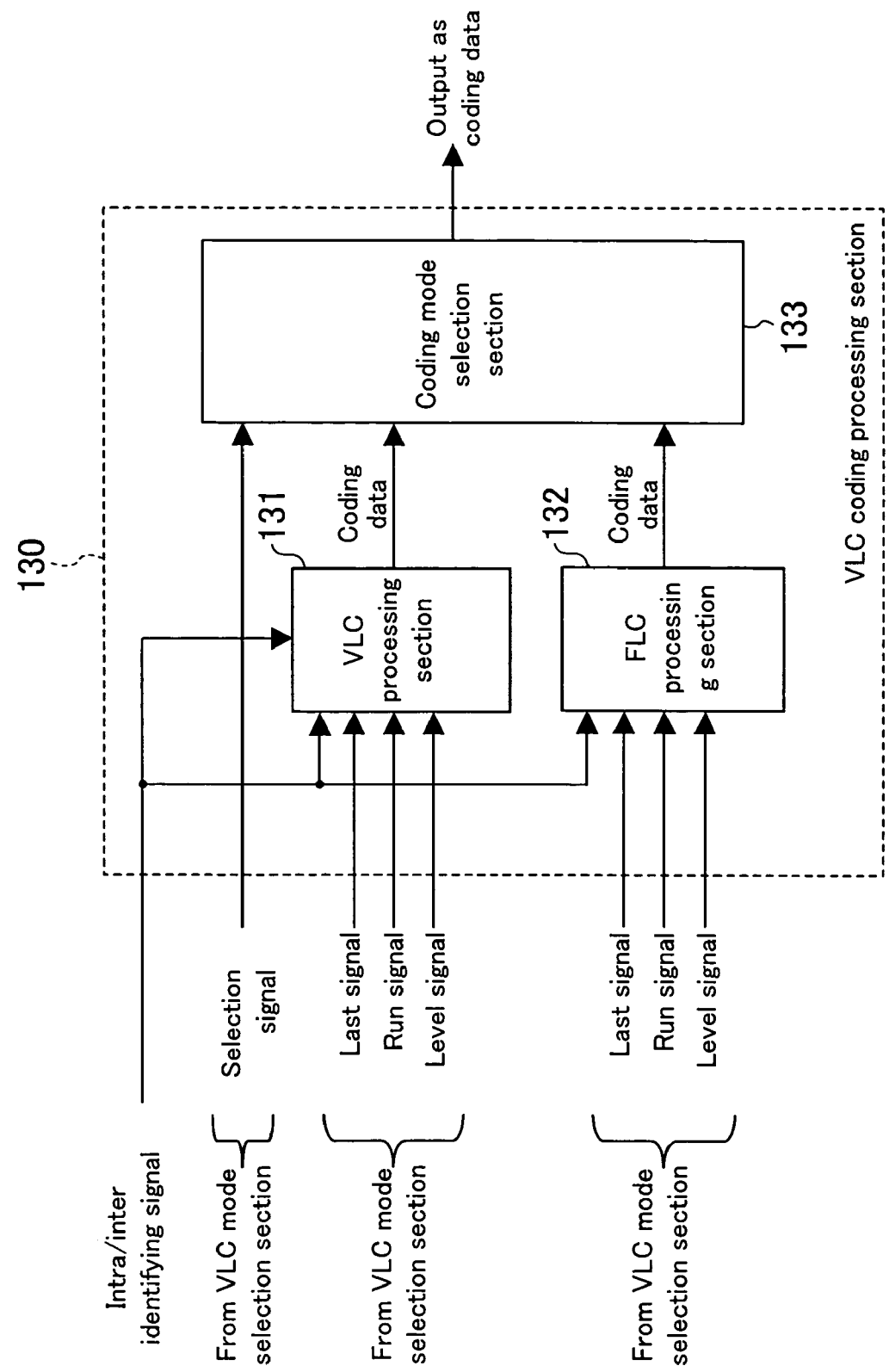
FIG. 8 is a block diagram illustrating a configuration of a VLC coding processing section according to the first embodiment of the present invention.

As shown in FIG. 8, the VLC coding section 130 is configured so as to include the VLC processing section 131, the FLC processing section 132 and a coding mode selection section 133 and outputs coding data to which variable-length coding has been performed.

(Configuration of FLC Processing Section 131)

According to the selection information, the VLC processing section 131 performs variable-length coding to the group (Last, Run, Level) output by the VLC coding pre-processing section 120 using a VLC table (see FIG. 9) to generate coding data and outputs the generated coding data to the coding mode selection section 133.

(Configuration of FLC Processing Section 132)

According to the selection information, the FLC processing section 132 performs transform (fixed-length coding) to the group (Last, Run, Level) output by the VLC coding pre-processing section 120 so that Last becomes 1 bit, Run becomes 6 bits, a Marker bit becomes 1 bit (1 bit code "1") and Level becomes 12 bits, thereby generating coding data. Then, the FLC processing section 132 outputs the generated coding data to the coding mode selection section 133. Specifically, the fixed-length coding is performed using a FLC table (see FIG. 10, FIG. 11 and FIG. 12).

(Configuration of Coding Mode Selection Section 133)

The coding mode selection section 133 selects, based on the selection information output by the VLC pre-processing section 120, one of the coding data output from the VLC processing section 131 and the coding data output from the FLC processing section 132, adds a code corresponding to a VLC mode judgment result thereto and then outputs the coding data (see FIG. 13).

(Operation of Variable-length Coding System 100)

Figure 14:
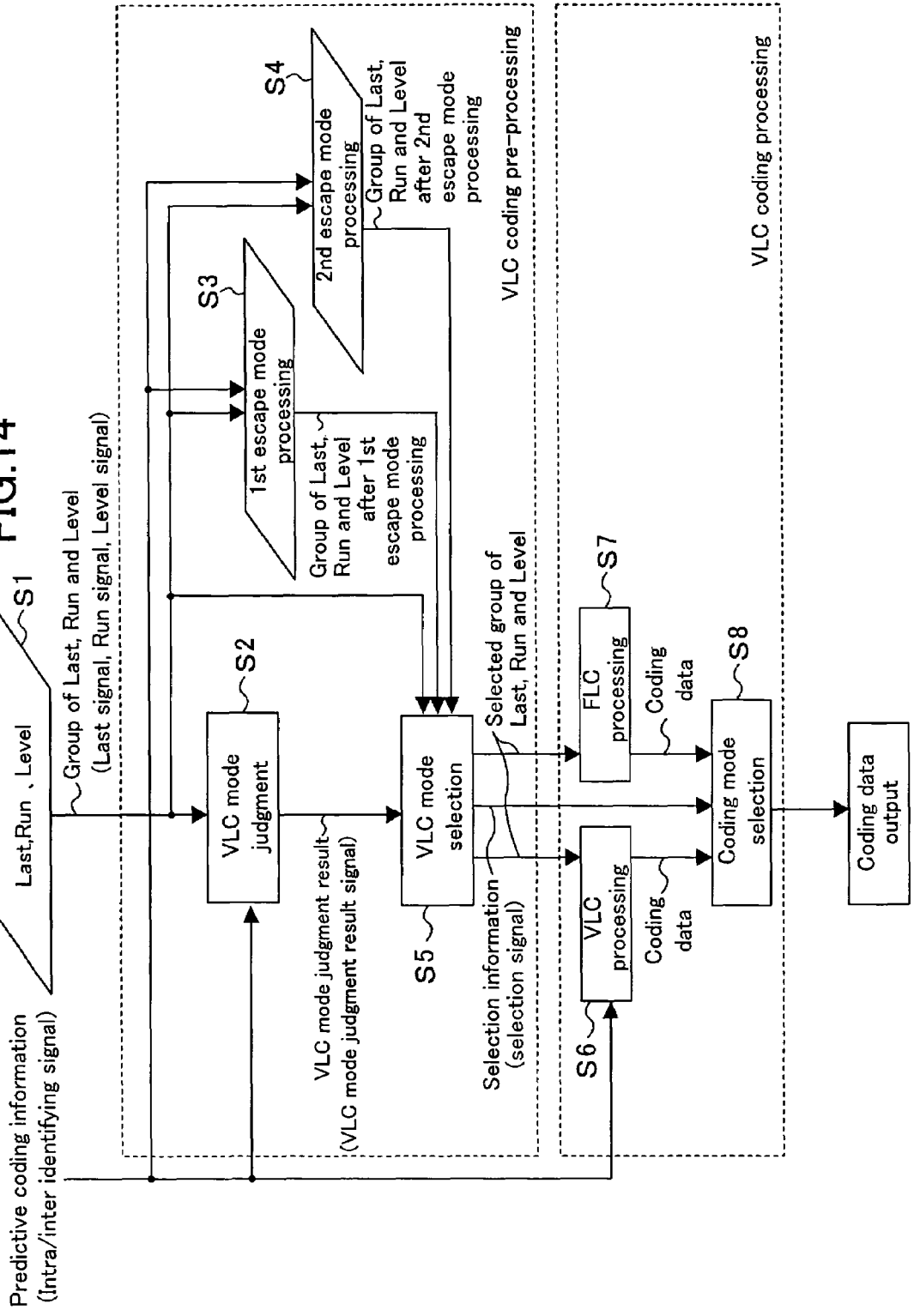
FIG. 14 is a flow chart schematically showing the order in which the process steps are performed and a flow of information (signal) in each process step in the variable-length coding system according to the first embodiment of the present invention.

In the variable-length coding system 100 configured to have the above-described configuration, DCT and quantization are performed to data in a macroblock and a group (Last, Run, Level) is generated by the transform section 110. Thereafter, process steps S1 through S8 shown in FIG. 14 are performed to code the data in the macroblock. FIG. 14 is a flow chart schematically showing the order in which the process steps are performed and a flow of information (signal) in each process step.

First, in Step S1, the transform section 110 outputs Last, Run and Level in the group (Last, Run, Level), which is to be a target of coding, as a Last signal, a Run signal and a Level signal, respectively, to the VLC mode judgment section 121, the first escape mode processing section 122, the second escape mode processing section 123 and the VLC mode selection section 124.

In Step S2, the VLC mode judgment section 121 performs the VLC mode judgment and escape mode judgment and outputs each judgment result to the VLC mode selection section 124 as a VLC mode judgment result signal.

In Step S3, the first escape mode processing section 122 obtains NewLevel for the group (Last, Run, Level) output by the transform section 110 using the equation for obtaining NewLevel and outputs, as a new group, a group (Last, Run, NewLevel) in which Level has been replaced with Level to the VLC mode selection section 124.

In Step S4, the second escape mode processing section 123 obtains NewRun for the group (Last, Run, Level) output by the transform section 110 using the equation for obtaining NewRun and outputs, as a new group, a group (Last, NewRun, Level) in which Run has been replaced with NewRun to the VLC mode selection section 124.

In Step S5, the VLC mode selection section 124 selects, based on a VLC mode judgment result, an effective group from the group (Last, Run, Level) output by the transform 110 (i.e., a group which is a target of coding), the group (Last, Run, NewLevel) output by the first escape mode processing section 122 and the group (Last, NewLast, Level) output by the second escape mode processing section 123. At the same time, the VLC mode selection section 124 selects, based on the VLC mode judgment result, an output direction (i.e., the VLC processing section 131 or the FLC processing section 132) to which the selected group is output.

The selected group is output as a new group (Last, Run, Level) to the selected output direction. In outputting the selected group, selection information indicating which "VLC processing" or "FL processing" has been selected is output as a selection signal to the coding mode selection section 133.

In Step S6, the VLC processing section 131 receives the effective group (Last, Run, Level) selected by the VLC mode selection section 124.

The VLC processing section 131 performs unique code allocation to the group using a VLC table and outputs coding data which is a result of the code allocation is output to the coding mode selection section 133.

In Step S7, the FLC processing section 132 receives the group (Last, Run, Level) selected by the VLC mode selection section 124.

The FLC processing section 132 performs transform of fixed-length coding to the group so that Last becomes 1 bit, Run becomes 6 bits, a Marker bit becomes 1 bit (1 bit code "1") and Level becomes 12 bits (see FIGS. 10 through 12) and outputs coding data resulting from the transform to the coding mode selection section 133.

In Step S8, the coding mode selection section 133 selects, based on the selection information received by the VLC mode selection section 124, one of the coding data output by the VLC processing section 131 and the coding data output by the FLC processing section 132. The coding mode selection section 133 adds a code shown in a table of FIG. 13 to the beginning of a code received from the VLC processing section 131 or the VLC processing section 132, and then outputs the received code as coding data.

The operation of the above-described variable-length coding system of this embodiment will be described for each of the cases where the VLC mode judgment result is "00", "01", "10" and "11" using specific numeral values.

1. The Case where VLC Mode Judgment Result is "00"

For example, respective steps in the case where a target macroblock for coding is an intra macroblock and a group (Last, Run, Level) generated by the transform section 110 is (0, 9, 2) will be described.

(Step S1) The transform section 110 outputs (0, 9, 2) which is a group (Last, Run, Level) to the VLC mode judgment section 121, the first escape mode processing section 122, the second escape mode processing section 123 and the VLC mode selection section 124.

(Step S2) The VLC mode judgment section 121 performs VLC mode judgment using a VLC judgment table. In this case, the group (Last, Run, Level) is (0, 9, 2) and the target macroblock is an "intra macroblock" and, therefore, the VLC mode judgment result is "00". The result "00" is output to the VLC mode selection section 124.

(Step S3) The first escape mode processing section 122 performs LMAX subtraction. In this case, Last="0" and Run="9" hold and, therefore, LMAX="2" and NewLevel="0" (see FIG. 5) are obtained. Thus, a new group (0, 9, 0) in which Level has been replaced with NewLevel is output from the first escape mode processing section 122 to the VLC mode selection section 124.

(Step S4) The second escape mode processing section 123 performs RMAX subtraction. In this case, Last="0" and Level="2" hold and, therefore, RMAX="9" (see FIG. 6) and NewRun="−1" are obtained. Thus, a new group (0, −1, 2) in which Run has been replaced with NewRun is output from the second escape mode processing section 123 to the VLC mode selection section 124.

(Step S5) The VLC mode selection section 124 receives the three groups, i.e., (0, 9, 2) output by the transform section 110, (0, 9, 0) output by the first escape mode processing section 122 and (0, −1, 2) output by the second escape mode processing section 123.

At the same time, the VLC mode selection section 124 receives a VLC mode judgment result signal. In this example, the VLC mode judgment result is "00" and, therefore, (0, 9, 2) output by the transform section 110 is selected as a group to be output (see FIG. 7). Moreover, an output direction is determined according to the VLC mode judgment result. In this case, "the VLC processing section" is selected.

In the manner described above, (0, 9, 2) output by the transform section 110 is output to the VLC processing section 131. Selection information to be output to the coding mode selection section 133 indicates "the VLC processing section".

(Step S6) The VLC processing section 131 performs coding to the received (0, 9, 2) using the VLC table (see FIG. 9) and outputs "000001000110" to the coding mode selection section 133.

(Step S7) The selection information indicates "the VLC processing section" and, therefore, the FLC processing section 132 does not perform processing.

(Step S8) The VLC mode judgment result is "00" and, therefore, the coding mode selection section 133 does not add a code to the coding data output by the VLC processing section 131 (see FIG. 13) and outputs "000001000110" as a result of coding of (0, 9, 2).

2. The Case where VLC Mode Judgment Result is "01"

For example, respective steps in the case where a target macroblock for coding is an inter macroblock and a group (Last, Run, Level) generated by the transform section 110 is (0, 2, 5) will be described.

(Step S1) The transform section 110 outputs (0, 2, 5) which is a group (Last, Run, Level) to the VLC mode judgment section 121, the first escape mode processing section 122, the second escape mode processing section 123 and the VLC mode selection section 124.

(Step S2) In the VLC mode judgment section 121, VLC mode judgment is performed using the VLC mode judgment table (see FIG. 3). The group (Last, Run, Level) is (0, 2, 5) and the target macroblock is an "inter macroblock" and, therefore, the VLC mode judgment result becomes "01". The result "01" is output to the VLC mode selection section 124.

(Step S3) The first escape mode processing section 122 performs LMAX subtraction. In this example, Last="0" and Run="2" hold, LMAX="4" (see FIG. 5) and NewLevel="1" are obtained. Thus, a new group (0, 2, 1) in which Level has been replaced by NewLevel is output from the first escape mode processing section 122 to the VLC escape mode processing section 124.

(Step S4) The second escape mode processing section 123 performs RMAX subtraction. In this example, Last="0" and Level="5" hold, RMAX="1" (see FIG. 6) and NewRun="0" are obtained. Thus, a new group (0, 0, 5) in which Run has been replaced with NewRun is output to the VLC mode selection section 124.

(Step S5) The VLC mode selection section 124 receives the three groups, i.e., (0, 2, 5) output by the transform section 110, (0, 2, 1) output by the first escape mode processing section 122 and (0, 0, 5) output by the second escape mode processing section 123. Also, a VLC mode judgment result signal is received at the same time. In this example, the VLC mode judgment result is "01" and, therefore, (0, 2, 1) output by the first escape mode processing section 122 is selected (see FIG. 3).

Moreover, an output direction is determined according to the VLC mode judgment result. In this example, "the VLC processing section" is selected. Accordingly, (0, 2, 1) is output to the VLC processing section 131. Selection information to be output to the coding mode selection section 133 indicates "the VLC processing section".

(Step S6) The VLC processing section 131 performs coding to the received group (0, 2, 1) using the VLC table (see FIG. 9) and "11100" is output to the coding mode selection section 133.

(Step S7) The selection information indicates "the VLC processing section" and, therefore, the FLC processing section 132 does not perform processing.

(Step S8) The VLC mode judgment result is "01" and, therefore, the coding mode selection section 133 adds "000001101" to the beginning of a code "11100" (see FIG. 13). Finally, "00000110111100" is output as a result of coding of (0, 2, 5).

3. The Case where VLC Mode Judgment Result is "10"

For example, respective steps in the case where a target macroblock for coding is an intra macroblock and a group (Last, Run, Level) generated by the transform section 110 is (0, 3, −9) will be described.

(Step S1) The transform section 110 outputs (0, 3, −9) which is a group (Last, Run, Level) to the VLC mode judgment section 121, the first escape mode processing section 122, the second escape mode processing section 123 and the VLC mode selection section 124.

(Step S2) The VLC mode judgment section 121 performs VLC mode judgment using the VLC mode judgment table (see FIG. 3). The group (Last, Run, Level) is (0, 3, −9) and the target macroblock is an "intra macroblock" and, therefore, the VLC mode judgment result is "10". The result "10" is output to the VLC mode selection section 124.

(Step S3) The first escape mode processing section 122 performs LMAX subtraction. In this example, Last="0" and Run="3" holds and, therefore, LMAX="4" (see FIG. 5) and NewLevel="5" are obtained. Thus, a new group (0, 3, −5) in which Level has been replaced with NewLevel is output from the first escape mode processing section 122 is output to the VLC mode selection section 124.

(Step S4) In the second escape mode processing section 123, RMAX subtraction is performed. In this example, "Last="0" and Level="−9" hold, RMAX="1" (see FIG. 6) and NewRun="1" are obtained. Thus, a new group (0, 1, −9) in which Run has been replaced with NewRun is output from the second escape mode processing section 123 to the VLC mode selection section 124.

(Step S5) The VLC mode selection section 124 receives the three groups, i.e., (0, 3, −9) output by the transform section 110, (0, 3, −5) output by the first escape mode processing section 122 and (0, 1, −9) output by the second escape mode processing section 123.

A VLC mode judgment result signal is also received at the same time. In this example, the VLC mode judgment result is "10" and, therefore, (0, 1, −9) output by the second escape mode processing section 123 is selected (see FIG. 7). Moreover, an output direction is determined according to the VLC mode judgment result. In this example, "the VLC mode processing section" is selected. In the above-described manner, (0, 1, −9) output by the second escape mode processing section 123 is output to the VLC processing section 131. The selection information to be sent to the coding mode selection section 133 is a signal indicating "the VLC processing section".

(Step S6) The VLC processing section 131 performs coding to the received group (0, 1, −9) using the VLC table (see FIG. 9) and outputs "0000010100111" to the coding mode selection section 133.

(Step S7) The selection information indicates "the VLC processing section" and, therefore, the FLC processing section 132 does not perform processing.

(Step S8) The VLC mode judgment result is "10" and, therefore, the coding mode selection section 133 adds "000001110" to the beginning of a code "0000010100111" (see FIG. 13). Finally, "0000011100000010100111" is output as a result of coding of (0, 3, −9).

4. The Case where VLC Mode Judgment Result is "11"

For example, respective steps in the case where a target macroblock for coding is an intra macroblock and a group (Last, Run, Level) generated by the transform section 110 is (1, 3, 5) will be described.

(Step S1) The transform section 110 outputs (1, 3, 5) as the group (Last, Run, Level) to the VLC mode judgment section 121, the first escape mode processing section 122, the second escape mode processing section 123 and the VLC mode selection section 124.

(Step S2) The VLC mode judgment section 121 performs VLC mode judgment using the VLC mode judgment table (see FIG. 3). The group (Last, Run, Level) is (1, 3, 5) and the target macroblock is an "intra macroblock" and, therefore, the VLC mode judgment result is "11". The result "11" is output to the VLC mode selection section 124.

(Step S3) The first escape mode processing section 122 performs LMAX subtraction. In this example, Last="1" and Run="3" hold and, therefore, LMAX="2" (see FIG. 5) and NewLevel="3" are obtained. Thus, a new group (1, 3, 3) in which Level has been replaced with NewLevel is output from the first escape mode processing section 122 to the VLC mode selection section 124.

(Step S4) In the second escape mode processing section 123, RMAX subtraction is performed. In this example, Last="1" and Level="5" hold and, therefore, RMAX="0" (see FIG. 6) and NewRun="2" are obtained. Thus, a new group (1, 2, 5) in which Run has been replaced with NewRun is output from the second escape mode processing section 123 to the VLC mode selection section 124.

(Step S5) The VLC mode selection section 124 receives the three groups, i.e, (1, 3, 5) output by the transform section 110, (1, 3, 3) output by the first escape mode processing section 122 and (1, 2, 5) output by the second escape mode processing section 123.

A VLC mode judgment result signal is also received at the same time. In this example, the VLC mode judgment result is "11" and, therefore, (1, 3, 5) output by the transform 110 is selected (see FIG. 7). Moreover, an output direction is determined according to the VLC mode judgment result. In this example, "the FLC processing section" is selected. In the above-described manner, (1, 3, 5) is output to the FLC processing section. Selection information output by the coding mode selection section 133 indicates "the FLC processing section".

(Step S6) The selection information indicates "the FLC processing section" and, therefore, the VLC processing section 131 does not perform processing.

(Step S7) The FLC processing section 132 performs fixed-length coding to the received group (1, 3, 5) and outputs "10000111000000000101" to the coding mode selection section 133 (see FIGS. 10 through 12).

(Step S8) The VLC mode judgment result is "11" and, therefore, the coding mode selection section 133 adds "000001111" to the beginning of a code "10000111000000000101" (see FIG. 13). Finally, "000001111100001110000000000101" is output as a result of coding of (1, 3, 5).

As described above, according to this embodiment, an escape mode suitable to the received group (Last, Run, Level) has been already determined before VLC table comparison. Thus, all groups (Last, Run, Level) can be coded in one cycle without requiring a plurality of VLC tables.

Embodiment 2

An exemplary variable-length coding system which allows further reduction in circuit size, compared to the variable-length coding system of the first embodiment. Note that each member having the same function as that in the first embodiment is identified by the same reference numeral and therefore the description thereof will be omitted.

Figure 15:
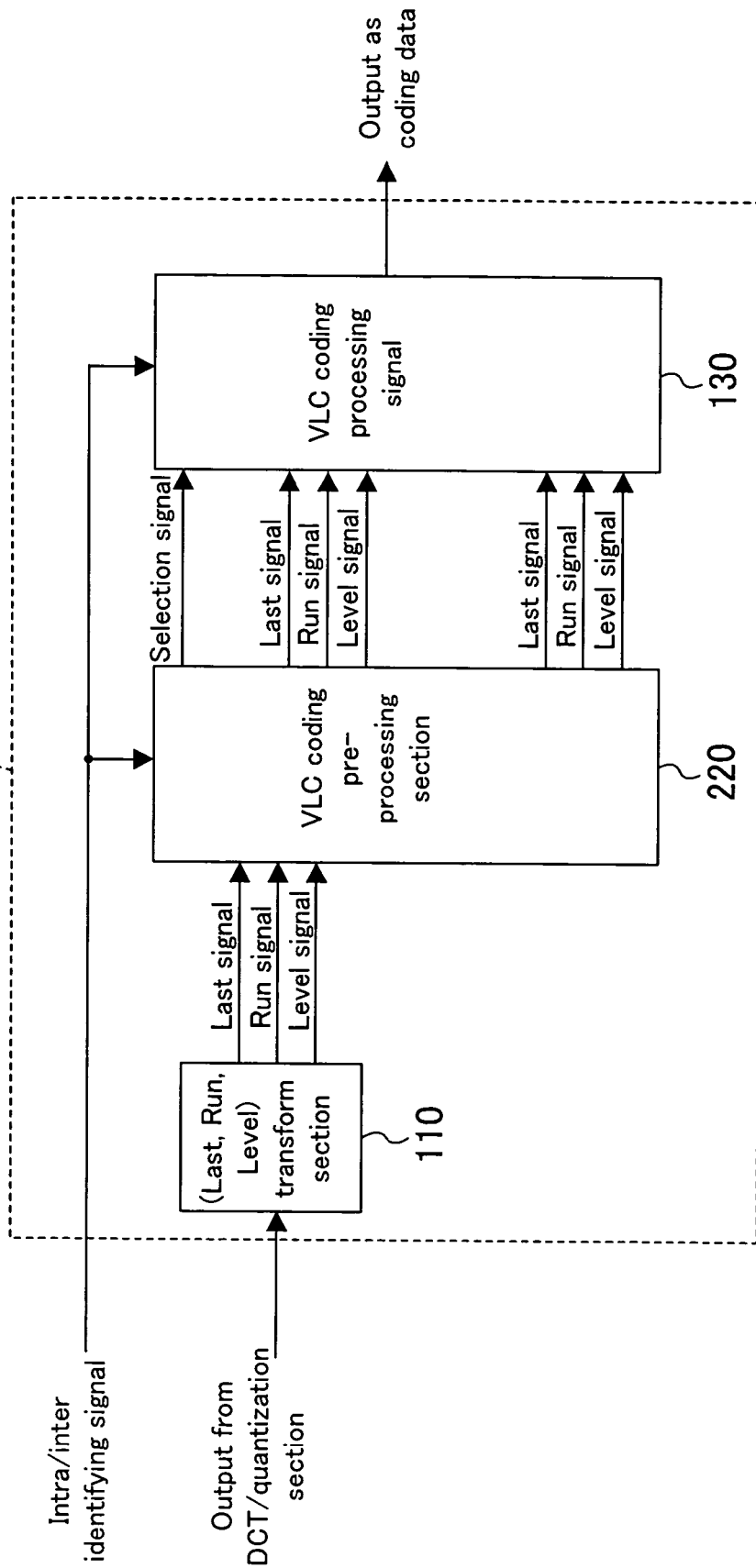
FIG. 15 is a block diagram illustrating a configuration of a variable-length coding system according to a second embodiment of the present invention.

FIG. 15 is a block diagram illustrating a configuration of a variable-length coding system 200 according to a second embodiment of the present invention. The variable-length coding system 200 is configured so as to include a VLC coding pre-processing section 220, instead of the VLC coding pre-processing section 120 of the variable-length coding system 100 of the first embodiment.

(Configuration of VLC Coding Pre-processing Section 220)

Figure 16:
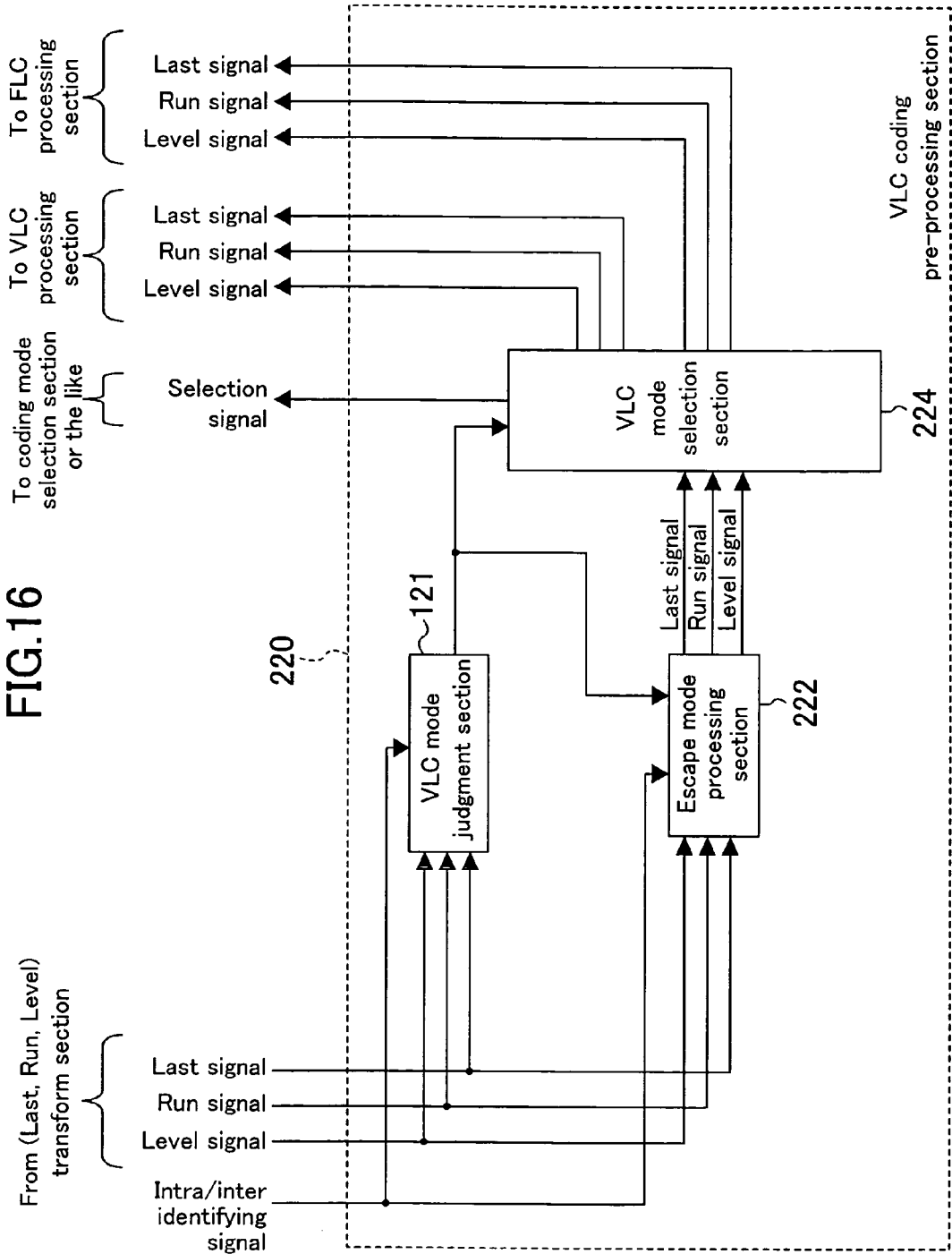
FIG. 16 is a block diagram illustrating a configuration of a VLC coding pre-processing section according to the second embodiment of the present invention.

As shown in FIG. 16, the VLC coding pre-processing section 220 is configured so as to include a VLC mode judgment section 121, an escape mode processing section 222 and a VLC mode selection section 224.

The escape mode processing section 222 has the function of performing the first escape mode processing and the second escape mode processing. The escape mode processing section 222 outputs, based on an intra/inter identifying signal (signal indicating a predictive coding mode) and a VLC mode judgment output by the VLC mode judgment section 121, one of the group (Last, Run, Level) generated by the first escape mode processing and the group (Last, Run, Level) generated by the second escape mode processing to the VLC mode selection section 224.

Thus, with the escape mode processing section 222 configured so as to have the function of performing the first escape mode processing and the second escape mode processing, commonality of circuits can be achieved. In this manner, this embodiment contributes to reduction in circuit size.

The VLC mode selection section 224 selects, based on the VLC mode judgment result, output by the VLC mode judgment section 121, a path to which the group (Last, Run, Level) output by the escape mode processing section 222 is output (as well as a path for outputting a signal to the VLC processing section 131 and a path for outputting a signal to the FLC processing section and outputs the group (Last, Run, Level) to the VLC coding section 130 through the selected path. Specifically, this selection operation by the VLC mode selection section 224 is performed based on a table shown in FIG. 17.

The VLC mode selection section 224 outputs, as a selection signal, selection information indicating which path has been selected and when the path has been selected to the VLC coding section 130.

(The Operation of Variable-length Coding System 200)

Figure 18:
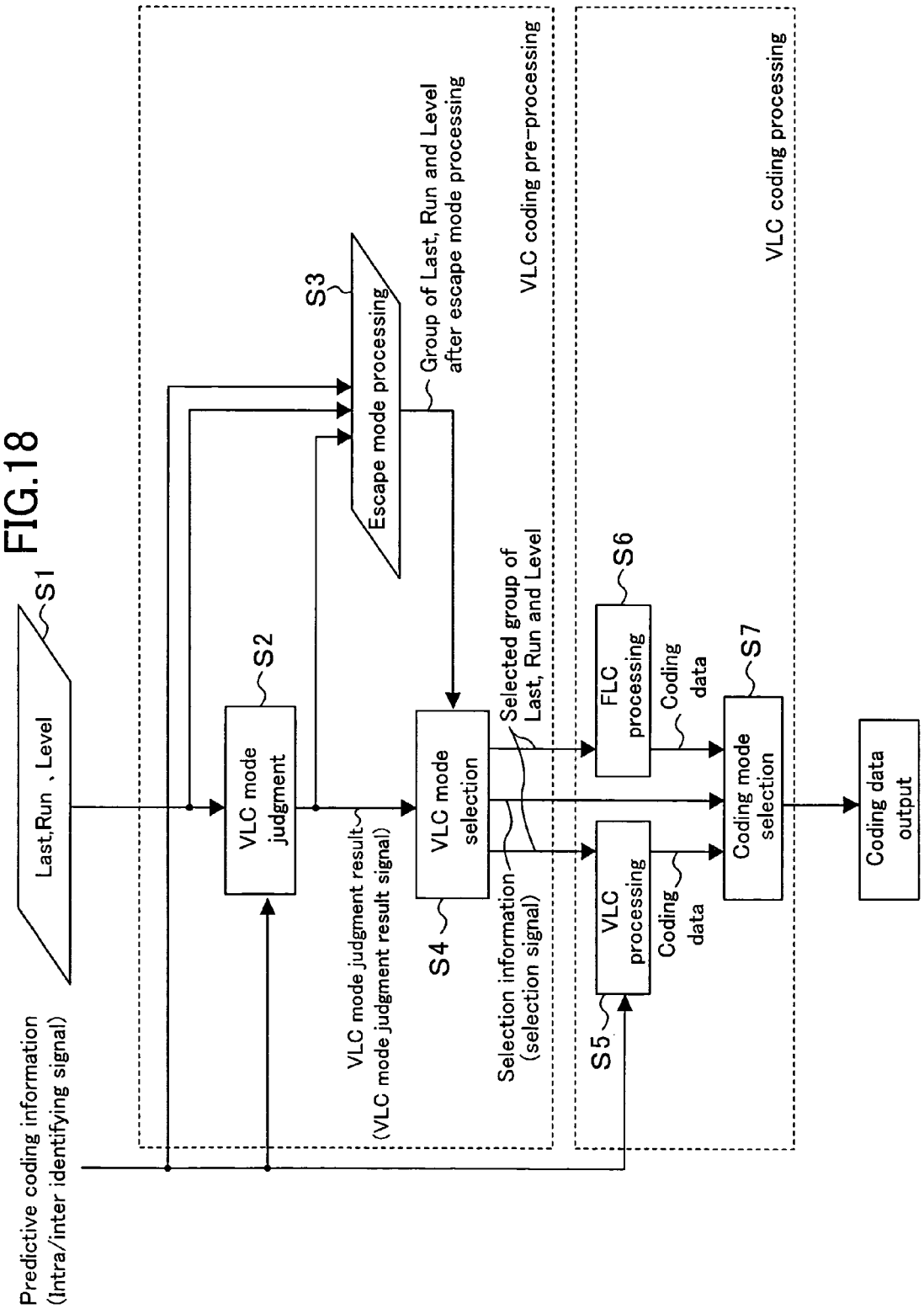
FIG. 18 is a flow chart schematically showing the order in which the process steps are performed and a flow of information (signal) in each process step in the variable-length coding system according to the second embodiment of the present invention.

In the variable-length coding system 200 configured to have the above-described configuration, first, DCT and quantization are performed to data in a macroblock and a group (Last, Run, Level) is generated by the transform section 110. Thereafter, Steps S1 through S7 of FIG. 18 are performed to encode the data in the macroblock. FIG. 18 is a flow chart schematically showing the order in which the process steps are performed and a flow of information (signal) in each process step.

In Step S1, the transform section 110 outputs Last, Run and Level of the group (Last, Run, Level) as a Last signal, a Run signal, and a Level signal, respectively, to the VLC mode judgment section 121, the escape mode processing section 222 and the VLC mode selection section 224.

In Step S2, the VLC mode judgment section 121 performs the VLC mode judgment and escape mode judgment and outputs judgment results as VLC judgment signals to the VLC mode selection section 224 and the escape mode processing section 222.

In Step S3, the escape mode processing section 222 outputs, based on a predictive coding mode and a VLC judgment result, one of the group (Last, Run, Level) generated by the transform section 110 and the group (Last, Run, Level) generated by the second escape mode processing to the VLC mode selection section 224.

In Step S4, based on the VLC mode judgment result output by the VLC mode judgment section 121, the VLC mode selection section 224 selects using the table of FIG. 17 a path for outputting the group (Last, Run, Level) output by the escape mode processing section 222 (a path for outputting a signal to the VLC processing section 131 and a path for outputting a signal to the FLC processing section 132) and outputs the group (Last, Run, Level) to the VLC coding section 130 through the selected path. The VLC mode selection section 224 outputs, as a selection signal, selection information indicating which path has been selected and when the path has been selected to the VLC coding section 130.

In Step S5, the VLC processing mode 131 receives the effective group (Last, Run, Level) selected in the VLC mode selection section 224. The VLC processing section 131 uniquely allocates a code to the group using a VLC table and outputs coding data which is a result of the allocation to the coding mode selection section 133.

In Steps S6, the FLC processing section 132 receives the group (Last, Run, Level) selected in the VLC mode selection section 124.

The FLC processing section 132 performs transform for the fixed-length coding to the group so that Last becomes 1 bit, Run becomes 6 bits, a Marker bit becomes 1 bit (1 bit code "1") and Level becomes 12 bits (see FIGS. 10 through 12) and outputs coding data which is a result of the transform to the coding mode selection section 133.

In Step S7, the coding mode selection section 133 selects, based on selection information received by the VLC mode selection section 124, one of the coding data output by the VLC processing section 131 and the coding data output by the FLC processing section 132. Based on the VLC mode judgment result contained in the selection signal, the coding mode selection section 133 adds a code shown in FIG. 13 to the beginning of the code received from the VLC processing section 131 or the FLC processing section 132 and then outputs a resultant code as coding data.

Respective steps in the above-described operation of the variable-length coding system of this embodiment, for example, when the VLC mode judgment result is "00", a macroblock which is a coding target is an intra macroblock and the group (Last, Run, Level) generated by the transform section 110 is (0, 9, 2) will be described.

(Step S1) The transform section 110 outputs (0, 9, 2) which is the group (Last, Run, Level) to the VLC mode judgment section 121 and the escape mode processing section 222.

(Step S2) The group (Last, Run, Level) is (0, 9, 2) and the macroblock which is a coding target is an "intra macroblock" and, therefore, the VLC mode judgment result of the VLC judgment section 121 becomes "00". The judgment result "00" is output to the VLC mode selection section 224 and the escape mode processing section 222.

(Step S3) In the escape mode processing section 222, based on the VLC judgment result, the first escape mode processing or the second escape mode processing is performed as necessary. In this example, the VLC mode judgment result is "00" and, therefore, neither the first escape mode processing nor the second escape mode processing is performed. The group (0, 9, 2) is then output to the VLC mode selection section 224 as it is without any change.

(Step S4) The VLC mode selection section 224 receives the VLC mode judgment result output by the VLC mode judgment section 121 and determines an output direction to which the group (Last, Run, Level) output by the escape mode processing section 222 is output. In this example, the VLC mode judgment result is "00" and, therefore, "the VLC processing section" is selected (see FIG. 7). Thus, (0, 9, 2) is output to the VLC processing section 131. Selection information indicating "the VLC processing" is output to the coding mode selection section 133.

(Step S5) The VLC processing section 131 performs coding using the VLC table (see FIG. 9). In this example, if coding is performed to the received group (0, 9, 2), "000001000110" is obtained. The coding result is output to the coding mode selection section 133.

(Step S6) The selection information indicates "the VLC processing section" and, therefore, the FLC processing section 132 does not perform processing.

(Steps S7) In the coding mode selection section 133, based on the selection information output by the VLC mode selection section 224, selection of coding mode is performed. In this example, the selection information indicates "the VLC processing section" and, therefore, an output of the VLC processing section 131 is received as coding data. Then, since the VLC mode judgment result contained in the selection signal is "00", a code is not added (see FIG. 13) and "000001100010" is output as a result of coding of (0, 9, 2).

As described above, also in this embodiment, an escape mode suitable for a received (Last, Run, Level) is has been already determined before VLC table comparison. Thus, all groups (Last, Run, Level) can be coded in a single cycle without requiring a plurality of VLC tables.

Moreover, in this embodiment, there is no need to perform the first escape mode processing and the second escape mode processing at the same time. Thus, with the escape mode processing section 222 configured to have the function of performing the first escape mode processing and the second escape mode processing, commonality of circuits can be achieved. In this manner, this embodiment contributes reduction in circuit size.

Embodiment 3

An exemplary variable-length coding system which allows more drastic reduction in VLC mode judgment table size, compared to the variable-length coding system of the first embodiment will be described.

Figure 19:
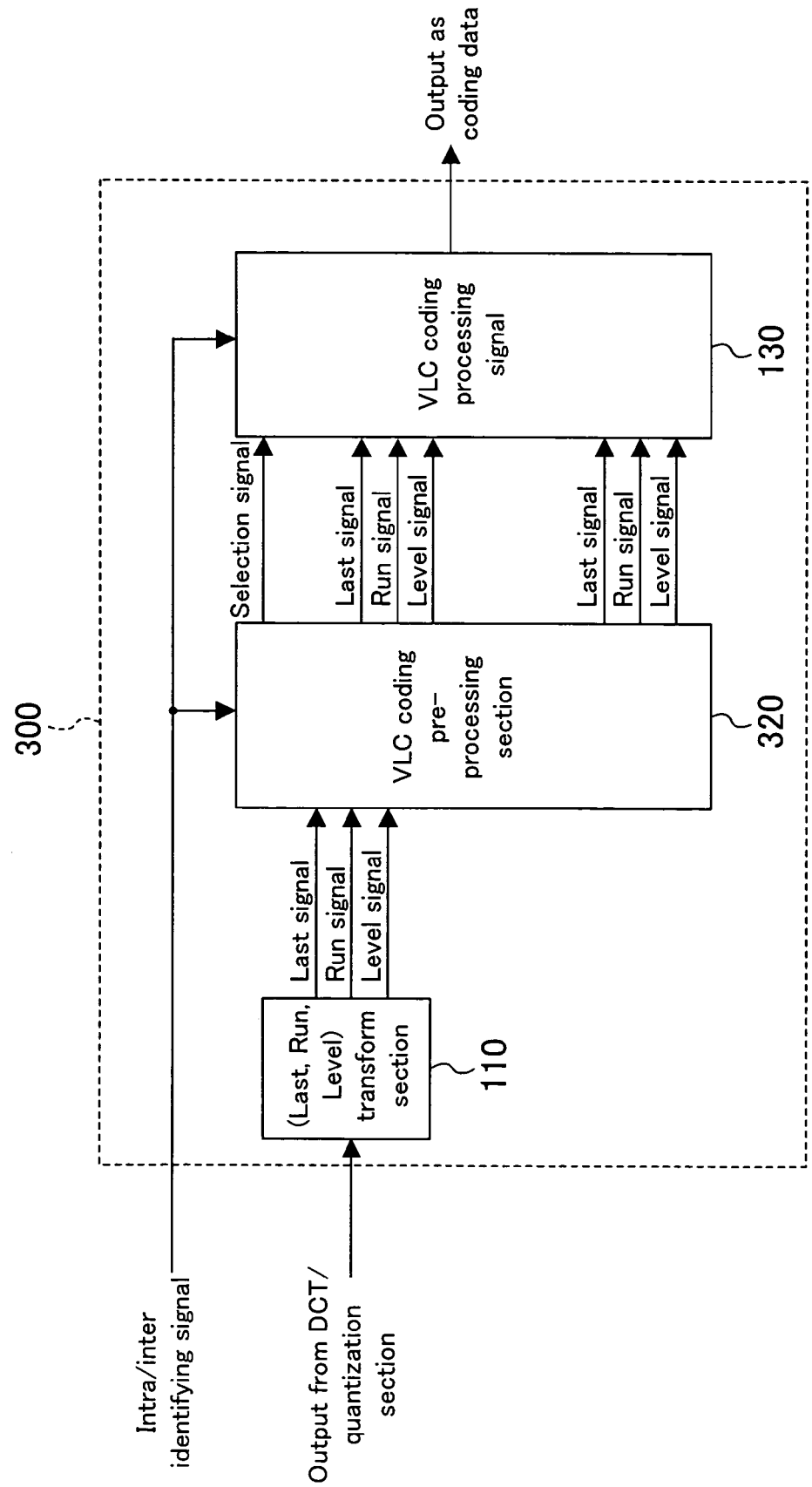
FIG. 19 is a block diagram illustrating a configuration of a variable-length coding system according to a third embodiment of the present invention.

FIG. 19 is a block diagram illustrating a configuration of a variable-length coding system 300 according to a third embodiment of the present invention. The variable-length coding system 300 is configured so as to include a VLC coding pre-processing section 320, instead of the VLC coding pre-processing section 120 of the variable-length coding system 100 of the first embodiment.

(Configuration of VLC Pre-processing Section 320)

Figure 20:
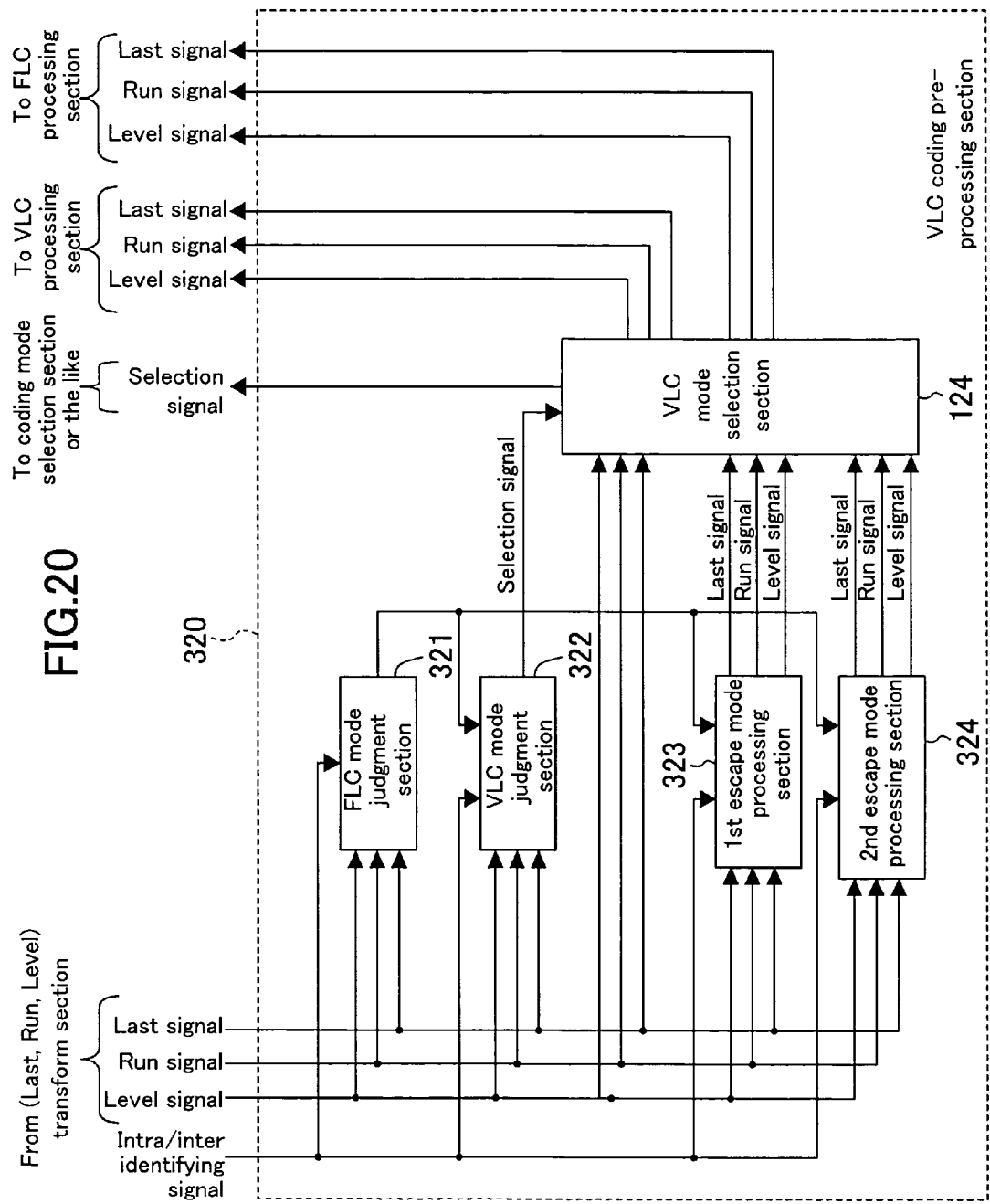
FIG. 20 is a block diagram illustrating a configuration of a VLC coding pre-processing section according to a third embodiment of the present invention.

As shown in FIG. 20, the VLC coding pre-processing section 320 is configured so as to include a VLC mode selection section 124, a FLC mode judgment section 321, a VLC mode judgment section 322, a first escape mode processing section 323 and a second escape mode processing section 324.

The FLC mode judgment section 321 judges whether or not a third escape mode is optimum for coding of the group (Last, Run, Level) output by the transform section 110.

In this judgment, first, using a FLC judgment table shown in FIG. 21, RunThr and LevelThr for judging whether or not the third escape mode is optimum are generated for a predictive coding mode indicated by an intra/inter identifying signal and Last of the group (Last, Run, Level). If Run≦RunThr and Level≦LevelThr are not satisfied, it is judged that the third escape mode is optimum. A judgment result (which will be hereafter referred to as a "FLC mode judgment result) is output as a FLC mode judgment result signal. The FLC mode judgment result is an output value of "0" or "1" in this embodiment. Respective meanings of output values are shown in a table of FIG. 22.

If it is judged in the FLC mode judgment section 321 that the third escape mode is optimum (specifically, if the FLC mode judgment result is "1"), the VLC mode judgment section 322 outputs "11", which indicates "the third escape mode" as the VLC mode judgment result. If it is not judged in the FLC mode judgment section 321 that the third escape mode is not optimum, the VLC mode judgment is performed and a judgment result of the VLC mode judgment is output to the VLC mode selection section 124.

If it is not judged in the FLC mode judgment section 321 that the third escape mode is optimum, the first escape mode processing section 323 performs the first escape mode processing to the received group (Last, Run, Level) and outputs a resultant signal to the VLC mode selection section 124. If it is judged in the FLC mode judgment section 321 that the third escape mode is optimum, the first escape mode processing section 323 does not perform the first escape mode processing and outputs the received group (Last, Run, Level) to the VLC mode selection section 124.

If it is not judged in the FLC mode judgment section 321 that the third escape mode is optimum, the second escape mode processing section 324 performs the second escape mode processing to the group (Last, Run, Level) and outputs a resultant signal to the VLC mode selection section 124. If it is judged in the FLC mode judgment section 321 that the third escape mode is optimum, the second escape mode processing section 324 does not perform the second escape mode processing and outputs the received group (Last, Run, Level) as it is to the VLC mode selection section 124.

(The Operation of Variable-length Coding System 300)

Figure 23:
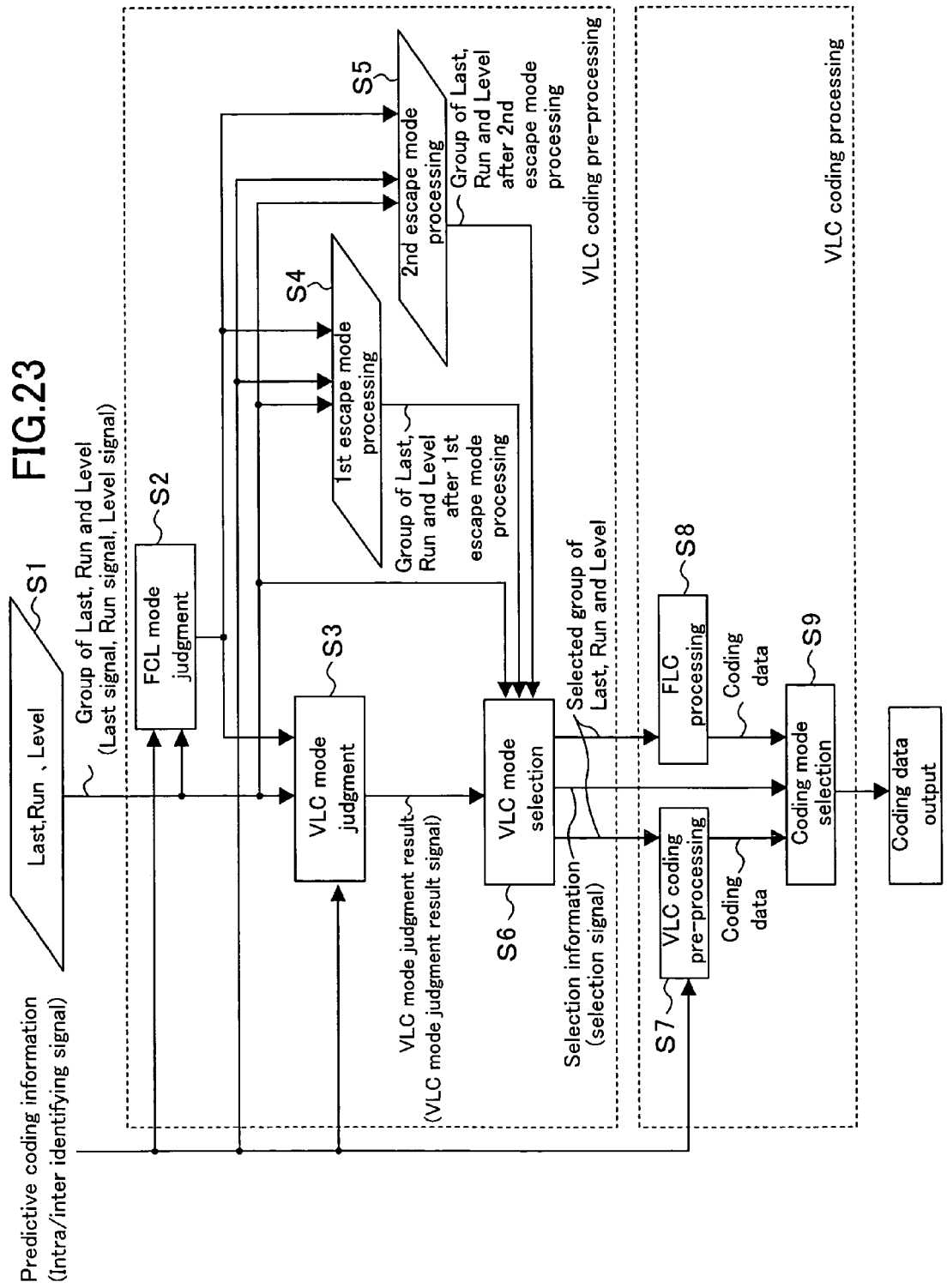
FIG. 23 is a flow chart schematically illustrating the order in which process steps are performed and a flow of information (signal) in each process step in the variable-length coding system according to the third embodiment of the present invention.

In the variable-length coding system 300 configured in the above-described manner, first, DCT and quantization are performed to data in a macroblock and a group (Last, Run, Level) is generated by the transform section 110. Thereafter, Steps S1 through S9 shown in FIG. 23 are performed to code the data in the macroblock. FIG. 23 is a flow chart schematically illustrating the order in which process steps are performed and a flow of information (signal) in each process step.

First, in Step S1, the transform section 110 outputs Last, Run, Level of the group (Last, Run, Level) which is to be a coding target as a last signal, a Run signal and a Level signal, respectively, to the FLC mode judgment section 321, the VLC mode judgment section 322, the first escape mode processing section 323 and the second escape mode processing section 324.

In Step S2, the FLC mode judgment section 321 judges whether or not the third escape mode is optimum for coding of the group (Last, Run, Level) output by the transform section 110. A FLC mode judgment result is output to the VLC mode judgment section 322, the first escape mode processing section 323 and the second escape mode processing section 324.

In Step S3, the VLC mode judgment section 322 performs VLC mode judgment according to the FLC judgment result.

In Step S4, the first escape mode processing section 323 performs the first escape mode processing according to the FLC mode judgment result.

In Step S5, the second escape mode processing section 324 performs the second escape mode processing according to the FLC mode judgment result.

In Step S6, the VLC mode selection section 124 selects, based on the VLC mode judgment result, an effective group from the group (Last, Run, Level) output by the transform section 110, the group (Last, Run, NewLevel) output by the first escape mode processing section 323 and the group (Last, NewRun, Level) output by the second escape mode processing section 324. At the same time, based on the VLC mode judgment result, an output direction (the VLC processing section 131 or the FLC processing section 132) to which the selected group is output is selected. The selected group is output as a new group (Last, Run, Level) to the selected output direction. At this time, selection information indicating which "the VLC mode processing" or "the FLC processing" has been selected is output as a selection signal to the coding mode selection section 133.

In Step S7, when the VLC processing section 131 is selected as the output direction in the VLC mode selection section 124, the VLC processing section 131 receives an effective group (Last, Run, Level) selected in the coding mode selection section 133. The VLC processing section 131 uniquely allocates a code to the received group using the VLC table and outputs a result of the allocation to the coding mode selection section 133.

In Step S8, when the FLC processing section 132 is selected as the output direction in the VLC mode selection section 124, the FLC processing section 132 receives the group (Last, Run, Level) selected in the VLC mode selection section 124. The FLC processing section 132 performs transform of fixed-length coding to the received group and outputs a result of the coding to the coding mode selection section 133.

In Step S9, the coding mode selection section 133 selects, based on the selection information received from the VLC mode selection section 124, one of the coding data output from the VLC processing section 131 and the coding data output from the FLC processing section 132. Based on the VLC mode judgment result contained in the selection signal, the coding mode selection section 133 adds a code shown in a table of FIG. 13 to the beginning of the code received from the VLC processing section 131 or the FLC processing section 132 and outputs a resultant signal as coding data.

Respective steps in the above-described operation of the variable-length coding system of this embodiment, for example, when the FLC mode judgment result is "1", the macroblock which is a coding target is an inter macroblock and the group (Last, Run, Level) generated by the transform section 110 is (1, 3, 7) will be described.

(Step S1) Each of the FLC mode judgment section 321, the VLC mode judgment section 322, the first escape mode processing section 323, the second escape mode processing section 324 and the VLC mode selection section 124 receives (1, 3, 7) from the transform section 110.

(Step S2) Last="1" holds and the macroblock which is a coding target is an inter macroblock and, therefore, the FLC mode judgment section 321 obtains RunThr="64" and LevelThr="6" from the FLC mode judgment table (see FIG. 21). For Run, Run≦RunThr is satisfied. But, for Level, Level≦LevelThr is not satisfied. Accordingly, it is judged that the third escape mode is optimum, and "1" is output as a FLC mode judgment result from the FLC mode judgment section 321 to the VLC mode judgment section 322, the first escape mode processing section 323 and the second escape mode processing section 324.

(Step S3) The FLC mode judgment result output by the FLC mode judgment section 321 is "1" and, therefore, the VLC mode judgment section 322 outputs "11" as the VLC mode judgment result to the VLC mode selection section 124.

(Step S4) The FLC mode judgment result output by the FLC mode judgment section 321 is "1" and, therefore, the first escape mode processing section 323 outputs the received group (1, 3, 7) as it is to the VLC mode selection section 124.

(Step S5) The FLC mode judgment result output by the FLC mode judgment section 321 is "1" and, therefore, the second escape mode processing section 324 outputs the received group (1, 3, 7) as it is to the VLC mode selection section 124.

(Step S6) The VLC mode judgment result output by the VLC mode judgment section 322 is "11" and, therefore, the VLC mode selection section 124 selects the (1, 3, 7) output by the transform section 110. The VLC mode selection section 124 also selects "the FLC processing section" as an output direction and outputs the selected (1, 3, 7) to the FLC processing section 132. Furthermore, the VLC mode selection section 124 outputs selection information indicating "the FLC processing" to the coding mode selection section 133.

(Step S7) In the VLC processing section 131, the selection information indicates that processing be performed in the "FLC processing section" and, therefore, processing is not performed.

(Step S8) In the FLC processing section 132, fixed-length coding is performed to (1, 3, 7) and "10000111000000000111" which is a result of the coding is output to the coding mode selection section 133.

(Step S9) In the coding mode selection section 133, based on the selection information output by the VLC mode selection section 124, coding mode selection is performed. In this example, the selection information indicates "the FLC processing" and, therefore, an output of the FLC processing section 132 is received as coding data. Then, based on the VLC mode judgment result, a code is added to the beginning of the received coding data. The VLC mode selection result is "11" and, therefore, "000001111" is added to the beginning of the coding data "10000111000000000111" (see FIG. 13). Finally, "000001111000011100000000111" is output as a result of coding of (1, 3, 7).

As described above, also in this embodiment, an escape mode suitable for a received group (Last, Run, Level) has been already determined before VLC table comparison and, therefore, all groups (Last, Run, Level) can be coded in a single cycle without requiring a plurality of VLC tables.

Moreover, in this embodiment, FLC mode judgment which is more simple than VLC mode judgment is performed first. Thus, the number of groups (Last, Run, Level) to which VLC mode judgment is performed, so that the size of VLC mode judgment table can be largely reduced.

Embodiment 4

An exemplary variable-length coding system in which a smaller size VLC mode judgment table than those of the variable-length coding systems of the first through third embodiments is used will be described.

Figure 24:
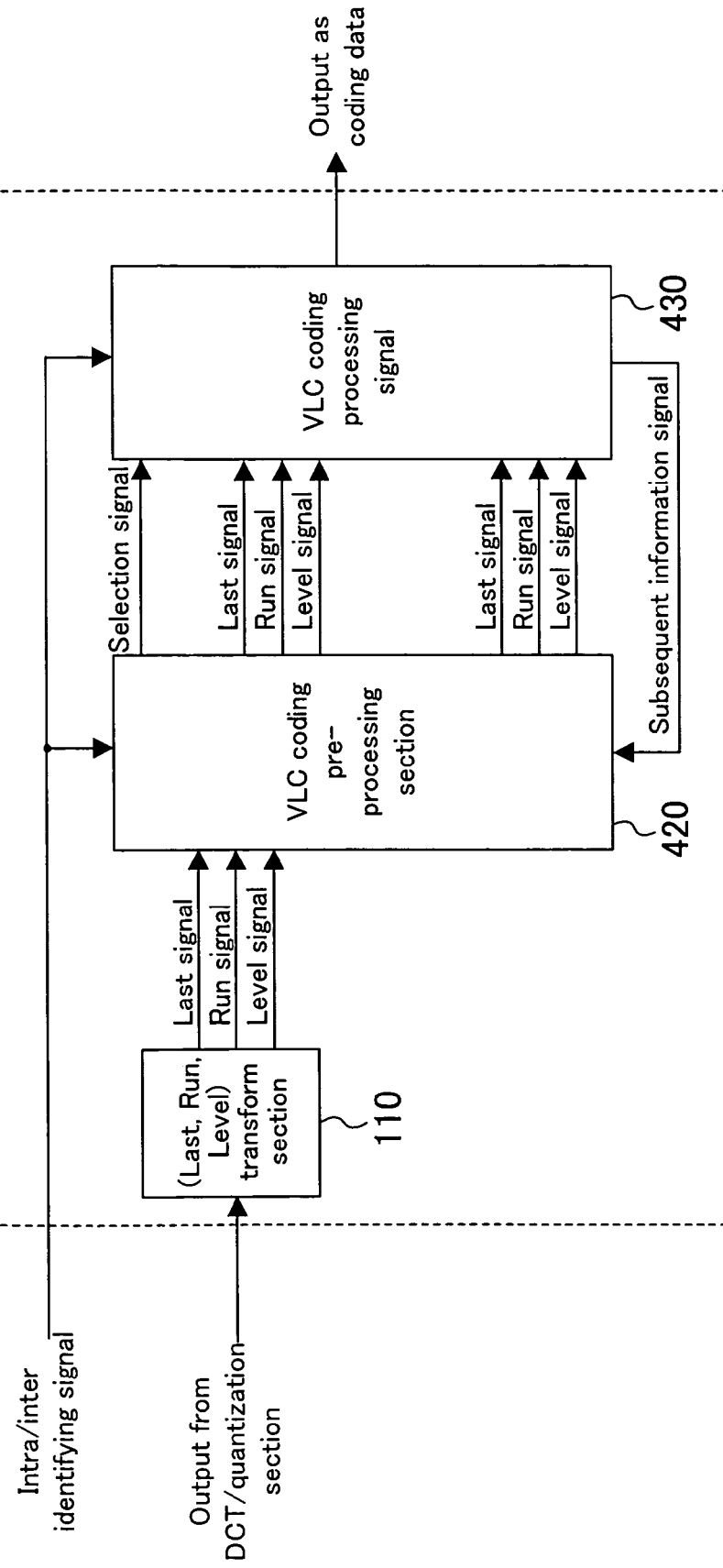
FIG. 24 is a block diagram illustrating a configuration of a variable-length coding system according to a fourth embodiment of the present invention.

FIG. 24 is a block diagram illustrating a configuration of a variable-length coding system 400 according to a fourth embodiment of the present invention. The variable-length coding system 400 is configured so as to include a transform section 110, a VLC coding pre-processing section 420 and a VLC coding section 430.

(Configuration of VLC Coding Pre-processing Section 420)

Figure 25:
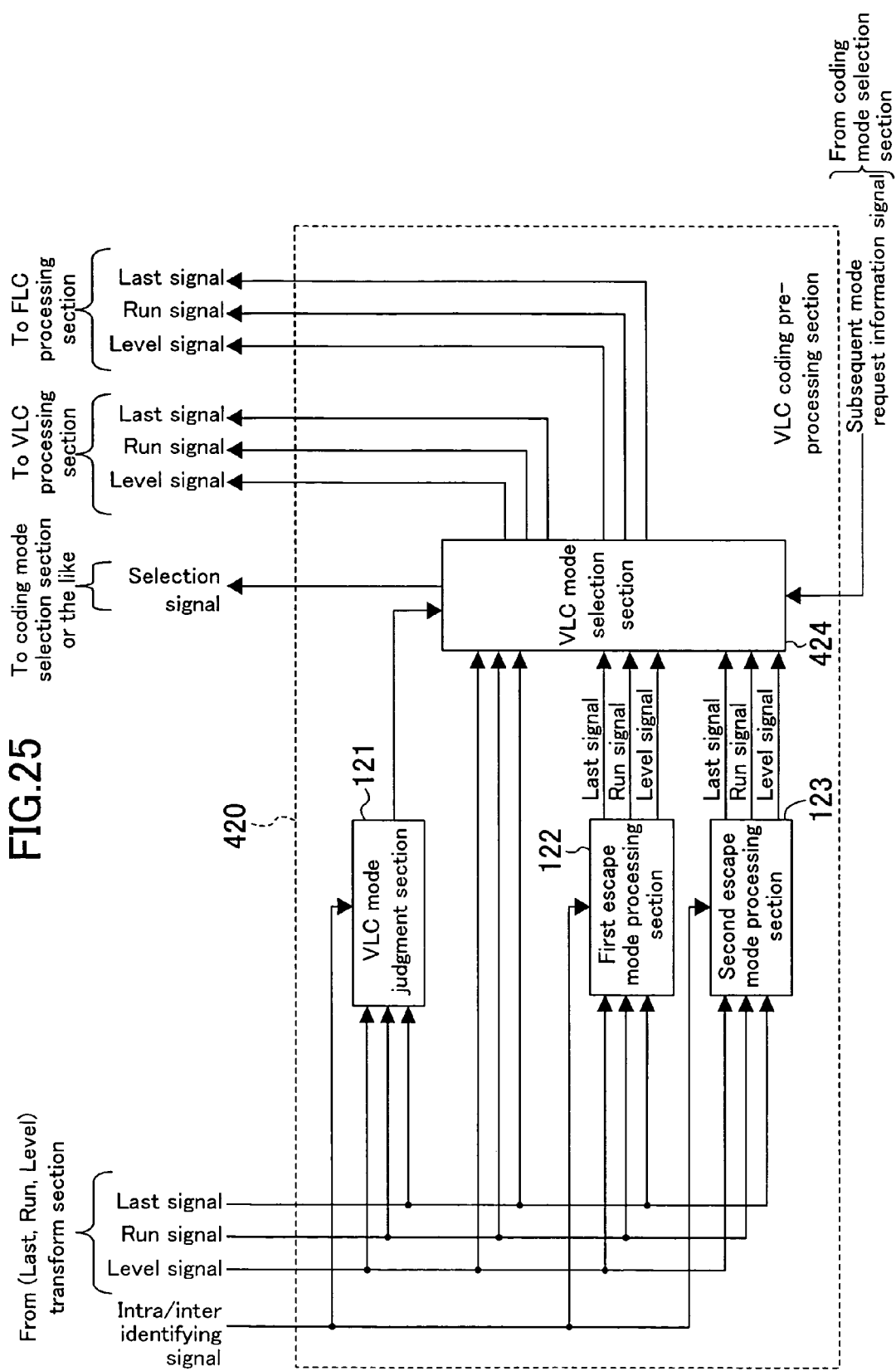
FIG. 25 is a block diagram illustrating a configuration of a VLC coding pre-processing section according to the fourth embodiment of the present invention.

As shown in FIG. 25, the VLC coding pre-processing section 420 is configured so as to include a VLC mode judgment section 121, a first escape mode processing section 122, a second escape mode processing section 123 and a VLC selection section 424.

The VLC mode selection section 424 is different from the VLC mode judgment section 121 of the first embodiment in that the VLC mode selection section 424 selects an effect group using not only the VLC mode judgment result but also subsequent mode request information (which will be described later) indicated by a subsequent mode request signal output by the VLC coding section 430 in selecting one of the three groups, i.e., the group (Lass, Run, Level) output by the transform section 110, the group (Last, Run, NewLevel) output by the first escape mode processing section 122 and the group (Last, NewRun, Level) output by the second escape mode processing section 123.

Specifically, selection using the VLC mode judgment result and the subsequent mode request information is performed based on a table shown in FIG. 26. As shown in the table, there might be cases where two groups are selected by the VLC mode selection section 424.

(Configuration of VLC Coding Section 430)

As shown in FIG. 27, the VLC coding section 430 is configured so as to include a FLC processing section 132, a VLC coding section 431 and a coding mode selection section 433.

When a group (Last, Run, Level) output by the VLC mode selection section 424 exists in the VLC table (see FIG. 9), the VLC processing section 431 variable-length codes the group (Last, Run, Level), based on the VLC table, and outputs coding data to the coding mode selection section 433.

The VLC processing section 431 outputs coding completion information indicating whether or not the group (Last, Run, Level) output by the VLC mode selection section 424 exists in the VLC table (i.e., whether or not variable-length coding is completed) as a coding completion signal to the coding mode selection section 433. In this embodiment, specifically, if coding is not completed, the coding completion information is set to be "0". If coding is completed, the coding completion information is set to be "1".

When the selection information indicates "the VLC processing" and variable-length coding is not completed in the VLC processing section 431, the coding mode selection section 433 outputs, as a subsequent mode request signal, subsequent mode request information for instructing processing in some other escape mode to the VLC mode selection section 424. In other cases, based on the VLC mode judgment result contained in the selection signal, a code shown in FIG. 13 is added to the beginning of the coding data output by the VLC processing section 431 or the FLC processing section 132 and a resultant signal is output as a result of the coding to the outside. In this embodiment, when an initial value is "00" and the coding completion information is "0" (i.e., coding could not be performed in the VLC processing section 431), a value of 1 is added to the subsequent mode request information at each time and then a resultant signal is output. Then, when a result of coding is output, the subsequent mode request information is reset.

(The Operation of Variable-length Coding System 400)

Figure 28:
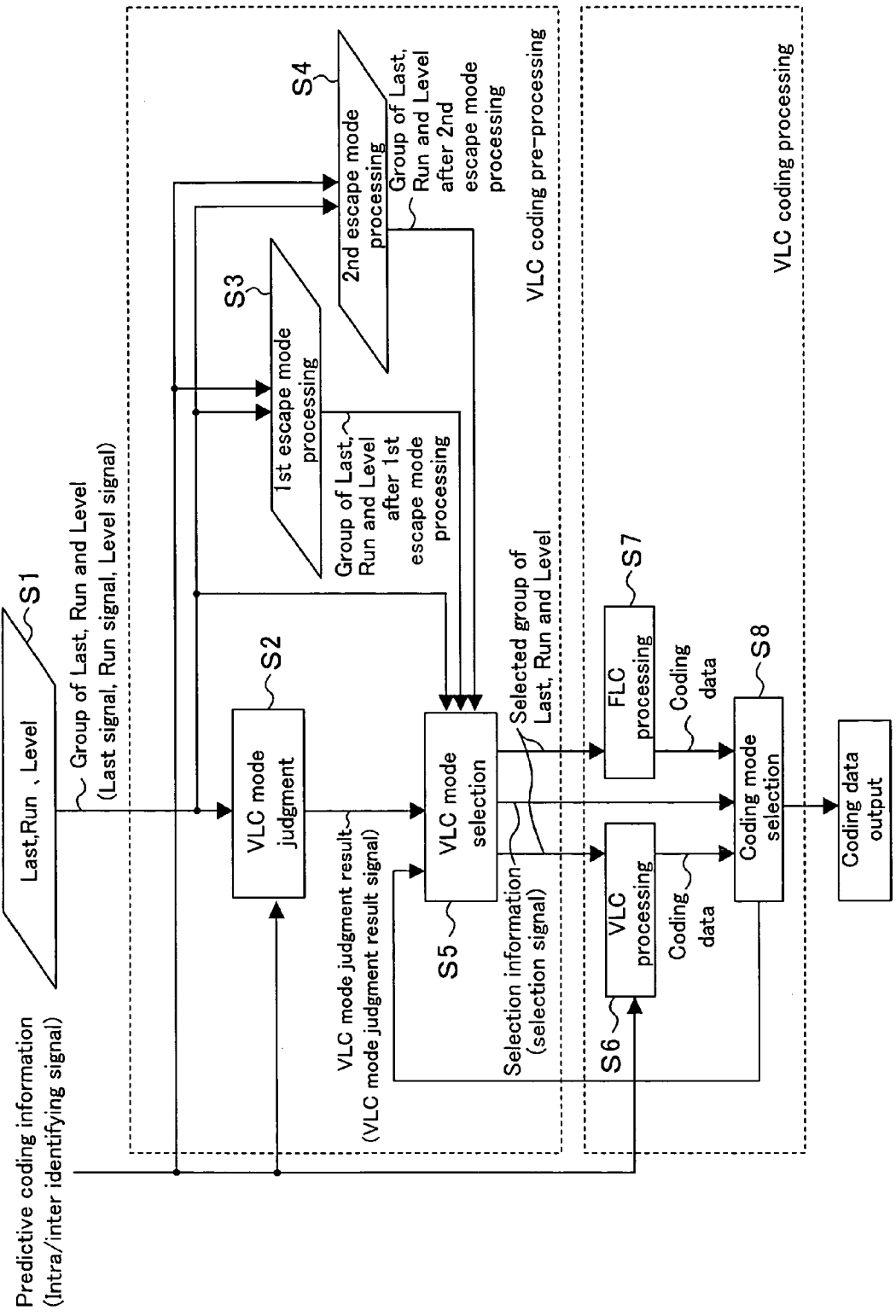
FIG. 28 is a flow chart schematically showing the order in which process steps are performed and a flow of information (signal) in each process step in the variable-length coding system according to the fourth embodiment of the present invention.

In the variable-length coding system 400 configured in the above-described manner, first, DCT and quantization are performed to data in a macroblock and a group (Last, Run, Level) is generated by the transform section 110. Thereafter, Steps S1 through S8 of FIG. 28 are performed and the data in the macroblock is coded. FIG. 28 is a flow chart schematically showing the order in which process steps are performed and a flow of information (signal) in each process step.

In Step S1, the transform section 110 outputs Last, Run and Level of the group (Last, Run, Level) as a Last signal, a Run signal and a Level signal, respectively, to the VLC mode judgment section 121, the first escape mode processing section 122, the second escape mode processing section 123 and the VLC mode selection section 424.

In Step S2, the VLC mode judgment section 121 performs the VLC mode judgment and escape mode judgment and outputs judgment results as LVC mode judgment result signals to the VLC mode selection section 424.

In Step S3, the first escape mode processing section 122 obtains NewLevel for the group (Last, Run, Level) output by the transform section 110 using the equation for obtaining NewLevel and outputs, as a new group, a group (Last, Run, NewLevel) in which Level has been replaced with Level to the VLC mode selection section 424.

In Step S4, the second escape mode processing section 123 obtains NewRun for the group (Last, Run, Level) output by the transform section 110 using the equation for obtaining NewRun and outputs, as a new group, a group (Last, NewRun, Level) in which Run has been replaced with NewRun to the VLC mode selection section 424.

In Step S5, the VLC mode selection section 424 selects, based on a VLC mode judgment result, one or two effective groups from the group (Last, Run, Level) output by the transform 110 (i.e., a group which is a target of coding), the group (Last, Run, NewLevel) output by the first escape mode processing section 122 and the group (Last, NewLast, Level) output by the second escape mode processing section 123. At the same time, the VLC mode selection section 424 selects, based on the VLC mode judgment result, an output direction (i.e., the VLC processing section 431 or the FLC processing section 132) to which the selected group is output.

The selected group is output as a new group (Last, Run, Level) to the selected output direction. In outputting the selected group, selection information indicating which one of "VLC processing", "FL processing" and "both of VLC processing and FL processing" has been selected is output to the coding mode selection section 433.

In Step S6, when the group (Last, Run, Level) output by the VLC mode selection section 424 exists in the VLC table, the VLC processing section 431 performs, based on the VLC table, unique code allocation and outputs coding data to the coding mode selection section 433. Also, the VLC processing section 431 sets the coding completion information to be "1" and outputs the coding completion information to the coding mode selection section 433.

Moreover, if the group (Last, Run, Level) output by the VLC mode selection section 424 does not exist in the VLC table, coding can not be performed. Then, the coding completion information is set to be "0" and then is output to the coding mode selection section 433.

In Step S7, the FLC processing section 132 performs transform for the fixed-length coding to the group (Last, Run, Level) output by the VLC mode selection section 424 and outputs a result (coding data) of the coding to the coding mode selection section 133.

In Step S8, when the selection information indicates "VLC processing" and coding completion information is "0", the coding mode selection section 433 outputs the subsequent mode request signal to the VLC mode selection section 424. In other cases, based on the VLC mode judgment result contained in the selection signal, the coding mode selection section 433 outputs coding data obtained by adding a code shown in FIG. 13 to the beginning of the coding data output by the VLC processing section 431 or the FLC processing section 132.

Respective steps in the above-described operation of the variable-length system of the fourth embodiment, for example, when the macroblock which is a processing target is an intra macroblock and the group (Last, Run, level) is (1, 3, 5) will be described.

(Step S1) First, the transform section 110 outputs (1, 3, 5) to the VLC mode judgment section 121, the first escape mode processing section 122, the second escape mode processing section 123 and the VLC mode selection section 424.

(Step S2) The VLC mode judgment section 121 performs the VLC mode judgment. The group (Last, Run, Level) is (1, 3, 5) and the macroblock which is a processing target is an "intra macroblock" and, therefore, (1, 3, 5) does not exist in the VLC mode judgment table. Accordingly, the VLC mode judgment result is "00" and the result "00" is output to the VLC mode selection section 424.

(Step S3) The first escape mode processing section 122 performs LMAX subtraction. In this example, Last="1" and Run="3" hold and, therefore, LMAX="2" and NewLevel="3" are obtained. Thus, a new group (1, 3, 3) in which Level has been replace with NewLevel is output from the first escape mode processing section 122 to the VLC mode selection section 424.

(Step S4) The second escape mode processing section 123 performs RMAX subtract. Last="1" and Level="5" hold, RMAX="0" (see FIG. 6) and NewRun="2" are obtained. Thus, a new group (1, 2, 5) in which Run has been replaced with NewRun is output from the second escape mode processing section 123 to the VLC mode selection section 424.

(Step S5) VLC mode selection section 424 receives three groups, i.e., (1, 3, 5) output by the transform section 110, (1, 3, 3) output by the first escape mode processing section 122 and (1, 2, 5) output by the second escape mode processing section 123. At the same time, the VLC mode selection section 424 also receives a VLC mode judgment result and subsequent request information (="00": initial value).

The VLC mode judgment result is "00" and the subsequent mode request information is "00" and, therefore, the VLC mode selection section 424 selects, as a group to be output, the group (1, 3, 5) output by the transform section 110. Also, based on the VLC mode judgment result and the subsequent mode request information, "the VLC mode judgment section" is selected as an output direction.

As described above, (1, 3, 5) output by the transform section 110 is output to the VLC processing section 431. The selection information to be output to the coding mode selection section 433 indicates "the VLC processing".

(Step S6) (1, 3, 5) output by the VLC mode selection section 424 does not exist in the VLC table (see FIG. 9). Accordingly, the VLC processing section 431 can not perform coding. Then, the coding completion information is set to be "0" and then is output to the coding mode selection section 433.

(Step S7) The selection information indicates "the VLC processing section" and, therefore, coding by the FLC processing section 132 is not performed.

(Step S8) The coding completion information output by the VLC processing section 431 is "0" and, therefore, the coding mode selection section 433 adds 1 to the subsequent mode request information (="00") and "01" is output to the VLC mode selection section 424.

As described above, coding is not completed when the processing is performed for the first time. Thus, Steps 5S through S8 are performed again in the variable-length coding system 400.

(Step S5) The VLC mode judgment result is "00" and the subsequent mode request information output by the coding mode selection section 433 is "01" and, therefore, (1, 3, 3) output by the first escape mode processing section 122 is selected in the VLC mode selection section 424 and then is output to the VLC processing section 431. The selection information indicating "the VLC processing" is output to the coding mode selection section 433.

(Step S6) (1, 3, 3) output by the first escape mode processing section 122 does not exist in the VLC table and, therefore, coding is not performed in the VLC processing section 431. The coding completion information is set to be "0" and is output to the coding mode selection section 433.

(Step S7) The selection section indicates "the VLC processing section" and, therefore, coding is not performed in the FLC processing section 132.

(Step S8) The coding completion information output by the VLC processing section 431 is "0" and, therefore, "10" obtained by adding 1 to the subsequent mode request information (="01") is output from the coding mode selection section 433 to the VLC mode selection section 424.

In this example, coding is not completed when the processing is performed for the second time. Thus, Steps S5 through S8 are further performed.

(Step S5) The VLC mode judgment result is "00" and the subsequent mode request information output by the coding mode selection section 433 is "10". Thus, in the VLC mode selection section 424, (1, 3, 5) output by the transform section 110 and (1, 2, 5) output by the second escape mode processing section 123 are selected (see FIG. 26). (1, 3, 5) output by the transform section 110 is output to the FLC processing section 132. (1, 2, 5) output by the second escape mode processing section 123 is output to the VLC processing section 431. The selection information indicating "the VLC processing and the FLC processing section" is output to the coding mode selection section 433.

(Step S6) (1, 2, 5) output by the first escape mode processing section 122 does not exist in the VLC table and, therefore, in the VLC processing section 431, coding processing is not performed. The coding information is set to be "0" and then is output to the coding mode selection section 433.

(Step S7) The selection information indicates "VLC processing and FLC processing section". Thus, in the FLC processing section 132, fixed-length coding is performed. When coding is performed to received (1, 3, 5), as shown in FIGS. 10 through 12, "10000111000000000101" is obtained. This coding result is output to the VLC mode selection section 424.

(Step S8) The selection information indicates "VLC processing and FLC processing", the coding mode selection section 433 receives respective outputs from both of the VLC processing section 431 and the FLC processing section 132.

On the other hand, the coding completion information output by the VLC processing section 431 is "0" and this shows that coding in the VLS processing section 431 is not completed. Coding data which has been fixed-length coded is output from the FLC processing section 132. Accordingly, as coding data for the group (1, 3, 5) output by the transform section 110, coding data "10001110000000000101" output from the FLC processing section 132 is selected.

Also, the VLC mode judgment result is "11" and, therefore, "000001111" is added to the beginning of the 10000111000000000101" (see FIG. 13). Finally, "00000111110000111000000000101" is output as coding data obtained by coding (1, 3, 5).

Then, coding processing is completed, and the subsequent mode request information is reset to be "00".

As described above, according to this embodiment, when a group (Last, Run, Level) exists in the VLC mode judgment table, coding is performed in a signal cycle, and, if not, coding is performed in three cycles at most.

For example, if the VLC mode judgment section 121 is configured so as to include only a VLC mode judgment table for interceding, a coding system in which all groups (Last, Run, Level) in an inter macroblock can be coded in a single cycle and all groups (Last, Run, Level) in an intra macroblock can be coded in three cycles is obtained. This method is very useful in reducing the size of a VLC mode judgment table and constructing a small size coding system in a coding specification in which an incidence of inter macroblock is high and an incident of intra macroblock is low, i.e., most of output codes are inter macroblock. In contrast, if the VLC mode judgment section 121 is configured so as to include only a VLC mode judgment table for intracoding, the method is very useful in reducing the size of a VLC mode judgment table and constructing a small size coding system in a coding specification in which most of output codes are intra macroblock.

For example, the VLC mode judgment section 121 is configured so as to include only a VLC mode judgment table used where Last="0" holds, a coding system in which all groups (Last, Run, Level) in a macroblock where Last="0" holds are coded in a single cycle, and all groups (Last, Run, Level) in a macroblock where Last="1" holds are coded in three cycles is obtained. When the maximum number of groups in a macroblock is 64, the number of times where "Last="1" is used is only once for every 64 times, that is, at a very low frequency. If coding is performed in such a specification, this method is very useful in constructing a small size coding system.

For example, if the VLC mode judgment section 121 is configured so as to include only a VLC mode judgment table used where Run<2 holds, a coding system in which all groups in a macroblock where Run<2 holds are coded in a single cycle and all groups in a macroblock where Run≧2 holds are coded in three cycles is obtained.

Assume that completion of coding of each coefficient in a single cycle is ensured. Where Run≧3 holds, there is no harm if three cycles are required in coding. Specifically, assume that three cycles are required for coding where Run=2 and Level=6 hold. In this case, since Run=2 and Level=6 hold, coefficients to be coded are two zero coefficient and 6, i.e., (0, 0, 6). Thus, coding has been performed for three coefficients, which shows that coding in which coding of a coefficient in a single cycle is realized. Therefore, completion of coding of one coefficient in a single cycle can be ensured by providing only a VLC judgment table used where Run<2.

As described above, according to this embodiment, the size of a VLC mode judgment table can be further reduced, compared to each of the foregoing first through third embodiments, and a small size coding system can be constructed.

Embodiment 5

As a system to which the variable-length coding system of each of the first through fourth embodiments is applied, an imaging system, such as a digital still camera (DSC), will be described.

Figure 29:
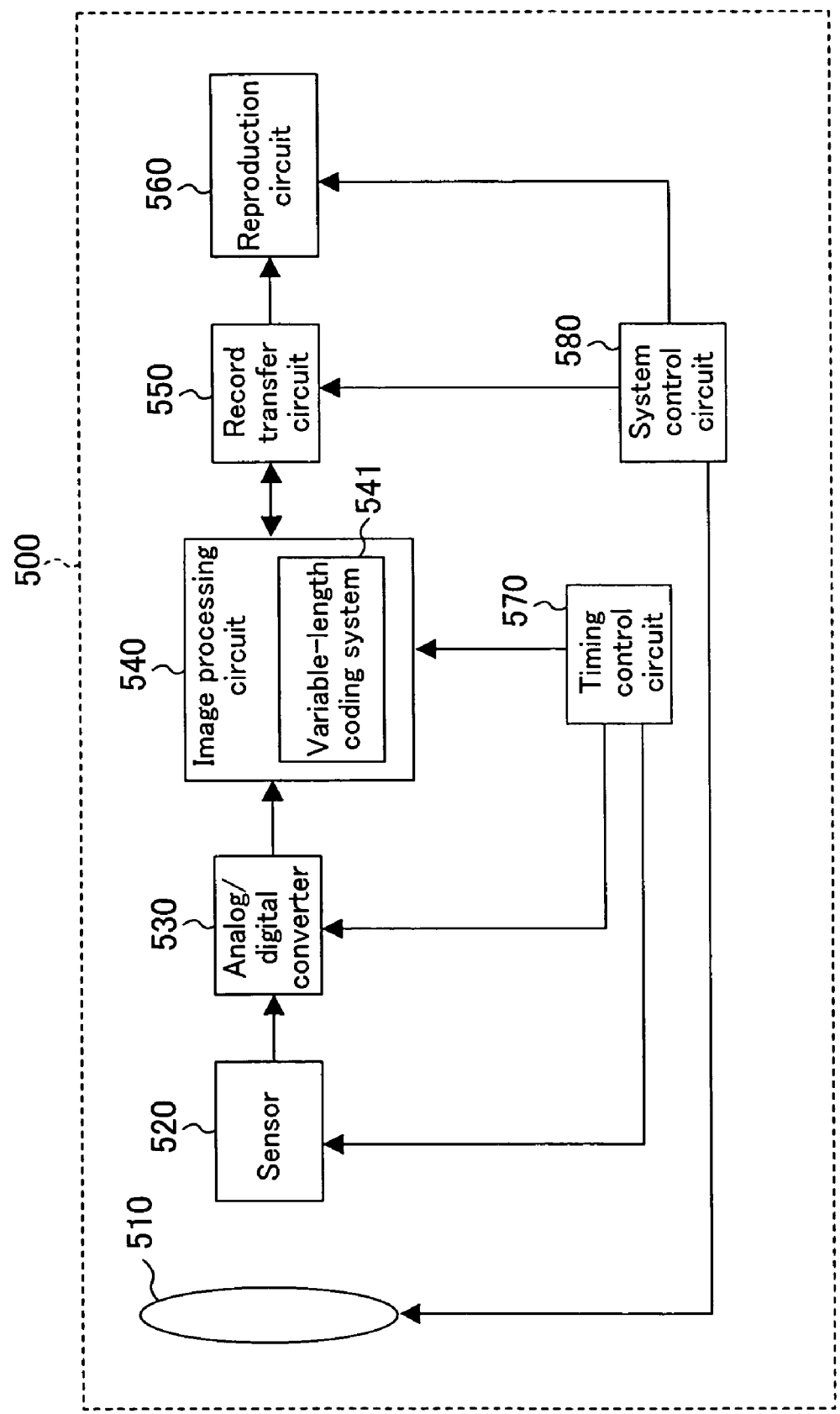
FIG. 29 is a block diagram illustrating a configuration of an imaging system according to a fifth embodiment of the present invention.

FIG. 29 is a block diagram illustrating a configuration of an imaging system 500 according to one of a fifth embodiment according to the present invention. As shown in FIG. 29, the imaging system 500 is configured so as to include an optical system 510, a sensor 520, an analog/digital (A/D) converter 530, an image processing circuit 540, a record transfer circuit 550, a reproduction circuit 560, a timing control circuit 570 and a system control circuit 580.

The optical system 510 forms an image of an incident image light on the sensor 520.

The sensor 520 stores the image light formed into an image and converts (photoelectric converts) the image into an electric signal.

The A/D converter 530 converts the electric signal output from the sensor 520 to a digital signal (image data).

The image processing circuit 540 includes a variable-length coding system 541 and performs Y/C processing, edge processing, image scaling, image compression/expansion and like image processing.

The variable-length coding system 541 is one of the respective variable-length coding systems of the above-described first through fourth embodiments.

The record transfer circuit 550 saves a signal image-processed by the image processing circuit 540 on a medium and outputs the signal to the reproduction circuit 560 for the purpose of reproduction.

The reproduction circuit 560 reproduces the saved or transferred signal.

The timing control circuit 570 controls an operation timing of the sensor 520 and the A/D converter 530.

The system control circuit 580 controls the operation of the entire imaging system 500.

In the imaging system 500 configured to have the above-described configuration, image data generated by the optical system 510, the sensor 520 and the A/D converter 530 is variable-length coded by the variable-length coding system 541. The variable-length coded data (coding data) is saved on a medium by the record transfer circuit 550 or reproduced by the reproduction circuit 560.

Thus, the variable-length coding system of the present invention can be constructed with a small size circuit configuration, and therefore is useful in application to the above-described imaging system and the like.

Image processing in the variable-length coding system 541 is not always applied to a signal based on image light formed into an image by the sensor 520 through the optical system 510, but may be used, for example, when an image signal received as an electric signal from an external system.

Figure 30:
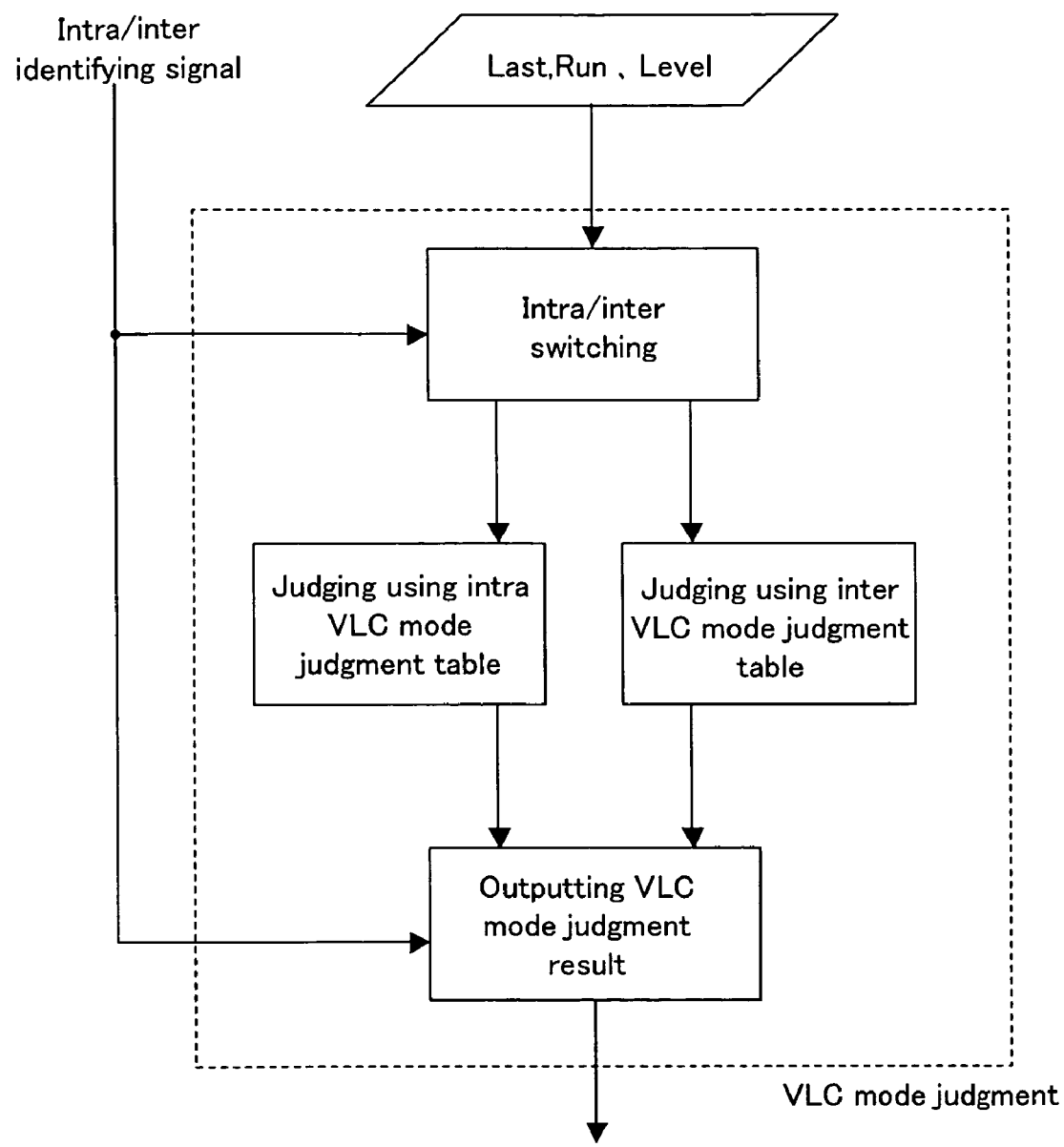
FIG. 30 is a flow chart schematically showing the order in which process steps are performed in a VLC mode judgment section when for a VLC mode judgment table, a VLC mode judgment table for intracoding and a VLC mode judgment table for interceding are separately provided.
Figure 31:
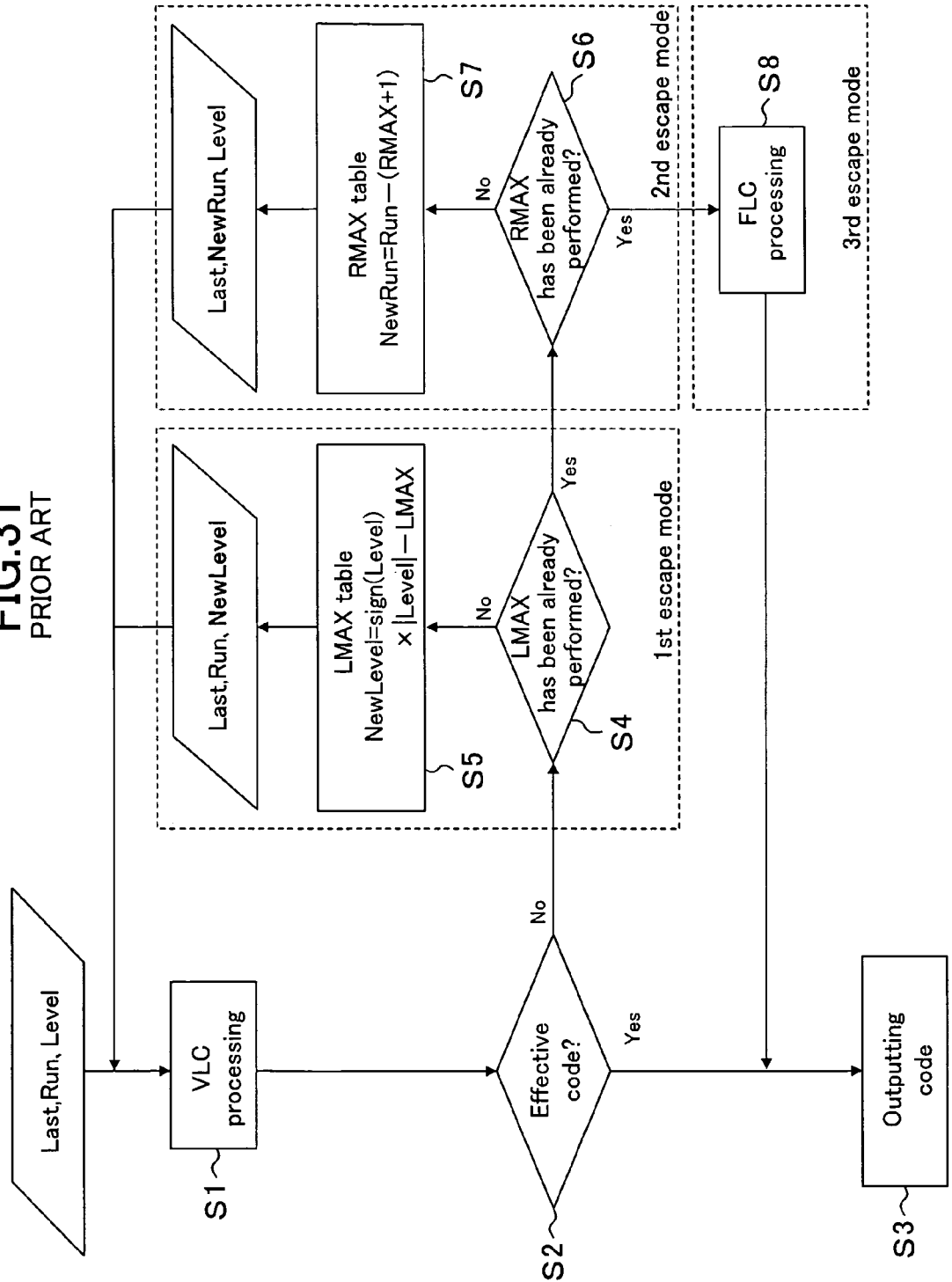
FIG. 31 is a flow chart schematically showing the operation of a known variable-length coding system.
Figure 32:
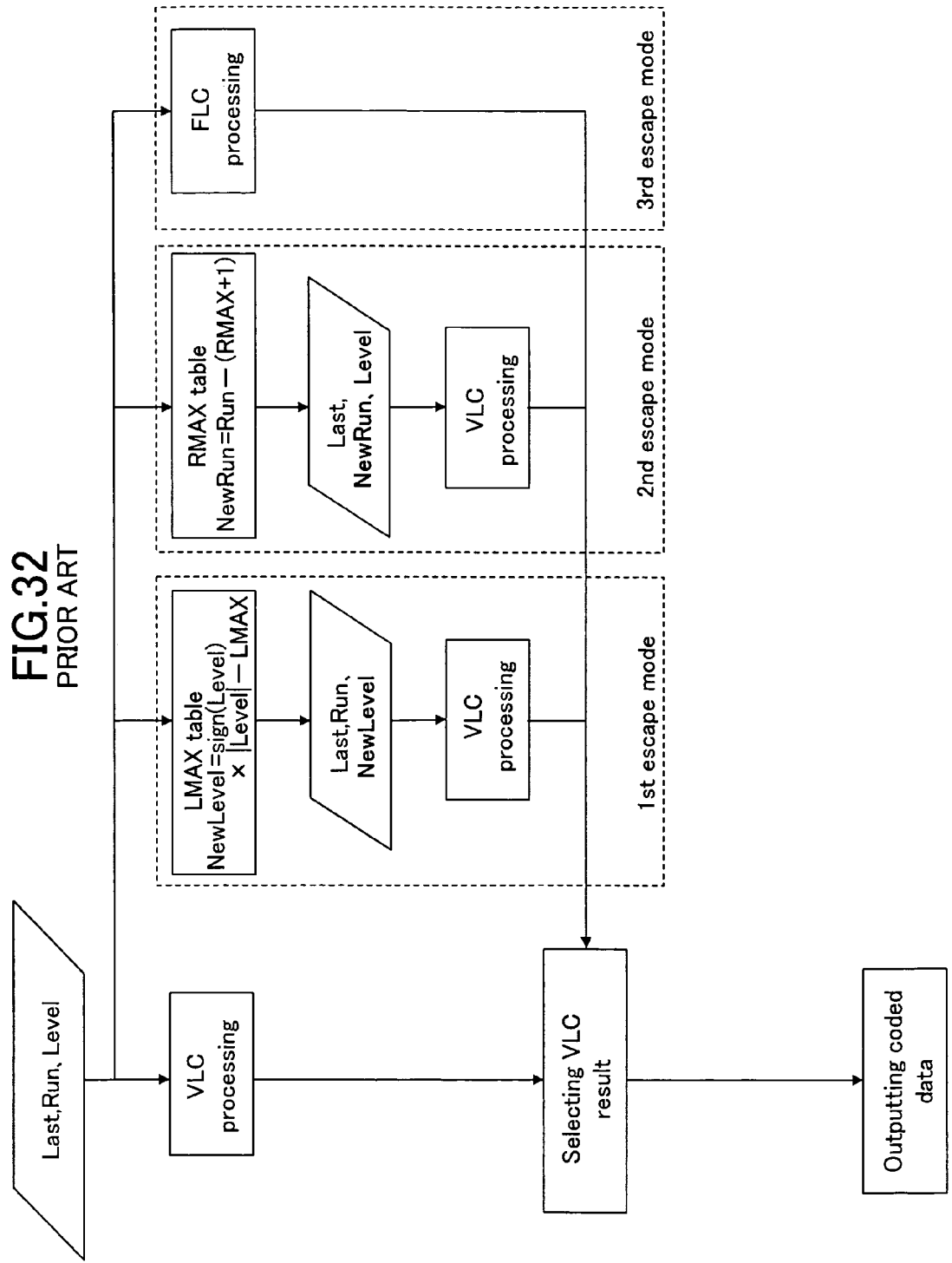
FIG. 32 is a flow chart schematically showing the operation of a known variable-length coding system.

In each of the variable-length coding systems of the above-described embodiments, an example in which a single VLC mode judgment table is used for VLC mode judgment has been described. However, the VLC mode judgment section 121 may be configured so as to perform judgment using a plurality of VLC mode judgment tables. For example, separate VLC mode judgment tables may be provided for intracoding and interceding, respectively, so that in coding, a table to be used is switched according to an intra/inter identifying signal. In this case, an intra/inter switching section for selecting one of the judgment section for intracoding and the judgment section for intracoding as a judgment section which receives a group (Last, Run, Level), and a VLC mode judgment result selection section for selecting one of the judgment sections from which an output as a judgment result is output are provided in the VLC mode judgment section 121 and, as shown in FIG. 30, switching between the tables is performed. FIG. 30 is a flow chart schematically showing the order in which process steps are performed.

Moreover, for example, separate VLC mode judgment tables, i.e., a VLC mode judgment table used where Last="0" holds and a VLC mode judgment table used where Last="1" holds may be provided so that in coding, a table to be used is switched according to a value of Last.

With use of a plurality of separate VLC mode judgment tables, for example, an operation clock signal to a memory in which a VLC mode judgment table for interceding is stored can be stopped in intracoding, and an operation clock signal to a memory in which a VLC mode judgment table for intracoding is stored can be stopped in interceding. This allows reduction in power consumption.

Moreover, the VLC processing section and the FLC processing section are exclusively used. Therefore, when selection information indicates "VLC processing", an operation clock signal of the FLC processing section may be stopped so that an operation clock signal is supplied only to the VLC processing section, and when the selection information indicates "FLC processing", an operation clock signal of the VLC processing section may be stopped so that an operation clock signal is supplied only to the FLC processing section. This allows reduction in power consumption.

An example in which in the FLC processing section, coding is performed using a FLC table has been described. However, coding may be performed not using a table but using a calculation method employing an equation.

When coding in the first escape mode and coding in the second escape mode are compared to each other, for example, there might be cases where a group (Last, Run, Level) in which a coding amount becomes smaller in coding in the second escape mode is present. In such a case, judgment is performed so that a result of VLC mode judgment using a VLC mode judgment table becomes the second escape mode. This allows output of coding data compressed to a further extent. That is, a VLC mode judgment table corresponding to a group (Last, Run, Level) may be configured so that an escape mode in which a coding amount is smaller is selected.

As has been described, a variable-length coding method, a variable-length coding system and an imaging system according to the present invention allow effective variable-length coding while suppressing increase in circuit size and, therefore, are useful in application to, for example, a variable-length coding system, an imaging system and the like realized in the MPEG method and the like.

What is claimed is:

1. A variable-length coding method for generating variable-length coding data from a coefficient series, the coefficient series including Run, Level and Last, Run indicating the number of zero coefficients before a non-zero coefficient, Level indicating a value of a non-zero coefficient, Last indicating whether or not the non-zero coefficient is the last coefficient in a DCT coefficient obtained by performing discrete cosine transform to digital data, the method comprising:

a first coefficient series generation step of generating a first coefficient series in which Level is replaced with NewLevel obtained, based on an equation of NewLevel=sign(Level)×(|Level|−LMAX) where sign (Level) is a code of Level and |Level| is an absolute value of Level, using LMAX which is a maximum value of Level corresponding to Last and Run in a given coefficient series in a VLC table showing the correlation between a coefficient series to be variable-length coded and variable-length coding data obtained by variable-length coding the coefficient series, a second coefficient series generation step of generating a second coefficient series in which Run in a given coefficient series is replaced with NewRun obtained, based on an equation of NewRun=Run−(RMA+1), using RMAX which is a maximum value of Run corresponding to Last and Level in the given coefficient series in the VLC table;

a VLC mode judgment step of judging, according to a given coefficient series, which one of a mode for coding the given coefficient series by variable-length coding, a mode for coding the first coefficient series by variable-length coding, a mode for coding the second coefficient series by variable-length coding and a mode for coding the given coefficient series by fixed-length coding should be used;

a coefficient series output step of outputting, based on a judgment result of the VLC mode judgment step, one of the given coefficient series, the first coefficient series and the second coefficient series;

a variable-length coding step of generating, based on the VLC table, variable-length coding data from the coefficient series output in the coefficient series outputting step;

a fixed-length coding step of generating fixed-length coding data obtained by fixed-length coding the coefficient series output in the coefficient series outputting step; and a coding data outputting step of outputting, based on the judgment result of the VLC judgment step, one of the variable-length coding data and the fixed-length coding data.

2. The variable-length coding method of claim 1, further comprising a FLC mode judgment step of judging, according to a given coefficient series, which variable-length coding or fixed-length coding should be performed to the given coefficient series, wherein when a judgment result of the FLC mode judgment step indicates that variable-length coding should be performed, which mode should be used for coding is judged in the VLC mode judgment step.

3. The variable-length coding method of claim 1, wherein when the judgment result of the VLC mode judgment step indicates that the first coefficient series should be coded in the mode for coding the first coefficient series by variable-length coding, the first coefficient series is generated by the first coefficient series generation step, and wherein when the judgment result of the VLC mode judgment step indicates that the second coefficient series should be coded in the mode for coding the second coefficient series by variable-length coding, the second coefficient series is generated by the second coefficient series generation step.

4. The variable-length coding method of claim 1, wherein in the VLC mode judgment step, using a VLC mode judgment table in which mode information indicating a correlation between a given coefficient series and a mode for coding the given coefficient series is stored, which mode should be used for coding is judged.

5. The variable-length coding method of claim 4, wherein the mode information is divided and stored separately in a plurality of VLC mode judgment tables.

6. The variable-length coding method of claim 5, wherein the digital data is data obtained by intraframe coding or interframe coding of image data, and wherein the plurality of VLC mode judgment tables include a VLC mode judgment table for a coefficient series corresponding to the image data obtained by intraframe coding and a VLC mode judgment table for a coefficient series corresponding to the image data obtained by interframe coding.

7. The variable-length coding method of claim 5, wherein the plurality of VLC mode judgment tables include a VLC mode judgment table for a coefficient series in which a value of Last indicates that the last coefficient is a non-zero coefficient and a VLC mode judgment table for a coefficient series in which a value of Last indicates that the last coefficient is not a non-zero coefficient.

8. The variable-length coding method of claim 4, wherein the VLC mode judgment table stores mode information for a coefficient series in which Run has a smaller value than a predetermined value.

9. The variable-length coding method of claim 4, wherein the digital data is data obtained by intraframe coding or interframe coding of image data, and wherein the VLC mode judgment table stores mode information for one of a coefficient series corresponding to the image data coded by intraframe coding and a coefficient series corresponding to the image data coded by interframe coding.

10. The variable-length coding method of claim 4, wherein the VLC mode judgment table stores mode information for one of a coefficient series in which a value of Last indicates that the last coefficient is a non-zero coefficient and a coefficient series in which a value of Last indicates that the last coefficient is not a non-zero coefficient.

11. The variable-length coding method of claim 1, wherein the VLC mode judgment table is formed so that a mode resulting in a smaller code amount is selected, as a judgment result, from the mode for coding the first coefficient series by variable-length coding and the mode for coding the second coefficient series by variable-length coding.

12. The variable-length coding method of claim 1, wherein the fixed-length coding step performs fixed-length coding, based on a FLC table indicating a correlation between a coefficient series which should be coded by variable-length coding and fixed-length coding data obtained by coding the coefficient series by fixed-length coding.

13. A variable-length coding system for generating variable-length coding data from a coefficient series, the coefficient series including Run, Level and Last, Run indicating the number of zero coefficients before a non-zero coefficient, Level indicating a value of a non-zero coefficient, Last indicating whether or not the non-zero coefficient is the last coefficient in a DCT coefficient obtained by performing discrete cosine transform to digital data, the system comprising:

a first coefficient series generation section for generating a first coefficient series in which Level is replaced with NewLevel obtained, based on an equation of NewLevel=sign(Level)×(|Level|−LMAX) where sign (Level) is a code of Level and |Level| is an absolute value of Level, using LMAX which is a maximum value of Level corresponding to Last and Run in a given coefficient series in a VLC table showing the correlation between a coefficient series to be variable-length coded and variable-length coding data obtained by variable-length coding the coefficient series;

a second coefficient series generation section for generating a second coefficient series in which Run in a given coefficient series is replaced with NewRun obtained, based on an equation of NewRun=Run−(RMA+1), using RMAX which is a maximum value of Run corresponding to Last and Level in the given coefficient series in the VLC table;

a VLC mode judgment section for judging, according to a given coefficient series, which one of a mode for coding the given coefficient series by variable-length coding, a mode for coding the first coefficient series by variable-length coding, a mode for coding the second coefficient series by variable-length coding and a mode for coding a given coefficient series by fixed-length coding should be used;

a coefficient series output section for outputting, based on a judgment result of the VLC mode judgment section, one of the given coefficient series, the first coefficient series and the second coefficient series;

a variable-length coding section for generating, based on the VLC table, variable-length length coding data from the coefficient series output in the coefficient series outputting section;

a fixed-length coding section for generating fixed-length coding data obtained by fixed-length coding the coefficient series output by the coefficient series outputting section; and a coding data outputting section for outputting, based on the judgment result of the VLC judgment section, one of the variable-length coding data and the fixed-length coding data.

14. The variable-length coding system of claim 13, further comprising a FLC mode judgment section for judging, according to a given coefficient series, which variable-length coding or fixed-length coding should be performed to the given coefficient series,
wherein when a judgment result of the FLC mode judgment section indicates that variable-length coding should be performed, the VLC mode judgment section judges which mode should be used for coding.

15. The variable-length coding system of claim 13, wherein when the judgment result of the VLC mode judgment section indicates that the first coefficient series should be coded in the mode for coding the first coefficient series by variable-length coding, the first coefficient series generation section generates the first coefficient series, and
wherein when the judgment result of the VLC mode judgment section indicates that the second coefficient series should be coded in the mode for coding the second coefficient series by variable-length coding, the second coefficient series generation section generates the second coefficient series.

16. The variable-length coding system of claim 13, wherein the VLC mode judgment section judges, using a VLC mode judgment table in which mode information indicating a correlation between a given coefficient series and a mode for coding the given coefficient series is stored, which mode should be used for coding.

17. The variable-length coding system of claim 16, wherein the mode information is divided and stored separately in a plurality of VLC mode judgment tables.

18. The variable-length coding system of claim 17, wherein the digital data is data obtained by intraframe coding or interframe coding of image data, and
wherein the plurality of VLC mode judgment tables include a VLC mode judgment table for a coefficient series corresponding to the image data obtained by intraframe coding and a VLC mode judgment table for a coefficient series corresponding to the image data obtained by interframe coding.

19. The variable-length coding system of claim 17, wherein the plurality of VLC mode judgment tables include a VLC mode judgment table for a coefficient series in which a value of Last indicates that the last coefficient is a non-zero coefficient and a VLC mode judgment table for a coefficient series in which a value of Last indicates that the last coefficient is not a non-zero coefficient.

20. The variable-length coding system of claim 17, further comprising a plurality of VLC mode judgment table memories corresponding to the plurality of VLC mode judgment tables, respectively,
wherein a clock signal for operation is supplied only to one of the VLC mode judgment table memories corresponding to one of the VLC mode judgment tables which is in use.

21. The variable-length coding system of claim 16, the VLC mode judgment table stores mode information for a coefficient series in which Run has a smaller value than a predetermined value.

22. The variable-length coding system of claim 16, wherein the digital data is data obtained by intraframe coding or interframe coding of image data, and
wherein the VLC mode judgment table stores mode information for one of a coefficient series corresponding to the image data coded by intraframe coding and a coefficient series corresponding to the image data coded by interframe coding.

23. The variable-length coding system of claim 16, wherein the VLC mode judgment table stores mode information for one of a coefficient series in which a value of Last indicates that the last coefficient is a non-zero coefficient and a coefficient series in which a value of Last indicates that the last coefficient is not a non-zero coefficient.

24. The variable-length coding system of claim 13, wherein the VLC mode judgment table is formed so that a mode resulting in a smaller code amount is selected, as a judgment result, from the mode for coding the first coefficient series by variable-length coding and the mode for coding the second coefficient series by variable-length coding.

25. The variable-length coding system of claim 13, wherein the fixed-length coding section performs fixed-length coding, based on a FLC table indicating a correlation between a coefficient series which should be coded by variable-length coding and fixed-length coding data obtained by coding the coefficient series by fixed-length coding.

26. The variable-length coding system of claim 25, further comprising:
a VLC table memory for storing the VLC table; and
a FLC table memory for storing the FLC table memory,
wherein only when the VLC table is used, the VLC table memory supplies a clock signal for operation and
only when the FLC table is used, the FLC table memory supplies a clock signal for operation.

27. An imaging system comprising:
the variable-length coding system of claim 13;
a sensor for translating image light to an image signal;
an optical system for imaging incident image light on the sensor; and
a converter for converting the image signal into digital data and outputting the digital data to the variable-length coding system.

28. An imaging system comprising:
the variable-length coding system of claim 13; and
a converter for converting a received image signal of an analog value into digital data and outputting the digital data to the variable-length coding system.

* * * * *